United States Patent [19]
Yano et al.

[11] Patent Number: 5,919,515
[45] Date of Patent: Jul. 6, 1999

[54] FERROELECTRIC THIN FILM, ELECTRIC DEVICE AND METHOD FOR PREPARING FERROELECTRIC THIN FILM

[75] Inventors: Yoshihiko Yano, Kanagawa; Takao Noguchi, Chiba, both of Japan

[73] Assignee: TDK Corporation, Japan

[21] Appl. No.: 08/855,444

[22] Filed: May 13, 1997

Related U.S. Application Data

[62] Division of application No. 08/524,809, Sep. 7, 1995.

[30] Foreign Application Priority Data

Aug. 25, 1995 [JP] Japan ................................. 7-240607

[51] Int. Cl.$^6$ ................................................. C23C 14/24
[52] U.S. Cl. ................................. 427/126.3; 427/126.1; 117/109
[58] Field of Search ............................. 427/126.3, 126.1; 117/109

[56] References Cited

U.S. PATENT DOCUMENTS

| | | | |
|---|---|---|---|
| 4,981,714 | 1/1991 | Ohno et al. ........................... | 427/126.3 |
| 5,108,984 | 4/1992 | Shioya et al. ........................... | 505/1 |
| 5,254,363 | 10/1993 | Kita et al. ........................... | 427/126.3 |
| 5,625,587 | 4/1997 | Peng et al. ........................... | 365/145 |

OTHER PUBLICATIONS

Yamaguchi et al, Jpn. J. Appl. Phys. Part I, vol. 30 No. 9B Sep. 1991, pp. 2197–2199.

Takashi Nakamura et al, "Study of Ferroelectric Thin Films for Application to DNRO Nonvolative Memories", Technical Report of IEICE. SDM93–130, Nov., 1993, No page number is available.

Hiroshi Maiwa et al, "Crystalline Structure of PbTiO$_3$ Thin Films by Multiple Cathode Sputtering", Jpn. J. Appll Phys. vol. 31 (1992) pp. 3029–3032, Part 1, No. 9B, Sep. 1992.

Takashi Hase et al, Pb(Zr, Ti0)O$_3$ Thin Films by Multitarget Sputtering, Jpn. J. Appl Phys. vol. 33 (1994) pp. 5244–5248, Part 1, No. 9b, Sep. 1994.

Jiyoung Kim et al, "Ultra–Thin Sputtered PZT Films for ULSI Drams", Mat. Res. Soc. Sympo. Proc., 310 (1993) pp. 473–478.

Landolt–Bornstein, Numerical Data and Functional Relationships in Science and Technology, Grup III: Crystal and Solid State Physics, volume 16, Revised, Updated and Extended Edition of Volumes III/3 and III/9, Ferroelectrics and Related Substances, Subvolume A: Oxides, (1981), pp. 1–43).

*Primary Examiner*—Roy V. King
*Attorney, Agent, or Firm*—Oblon, Spivak, McClelland, Maier, Neustadt, P.C.

[57] ABSTRACT

On a single crystal substrate such as silicon, a ferroelectric thin film having a YMnO$_3$ hexagonal crystal structure, composed mainly of a rare earth element (inclusive of scandium and yttrium), manganese and oxygen, and c-plane oriented parallel to the substrate surface is formed, preferably with an epitaxial oxide film or conductive epitaxial film being interposed therebetween. It is suitable for gate type non-volatile memory devices having MFIS and MFMIS structures.

11 Claims, 24 Drawing Sheets

10 μm

10 μm

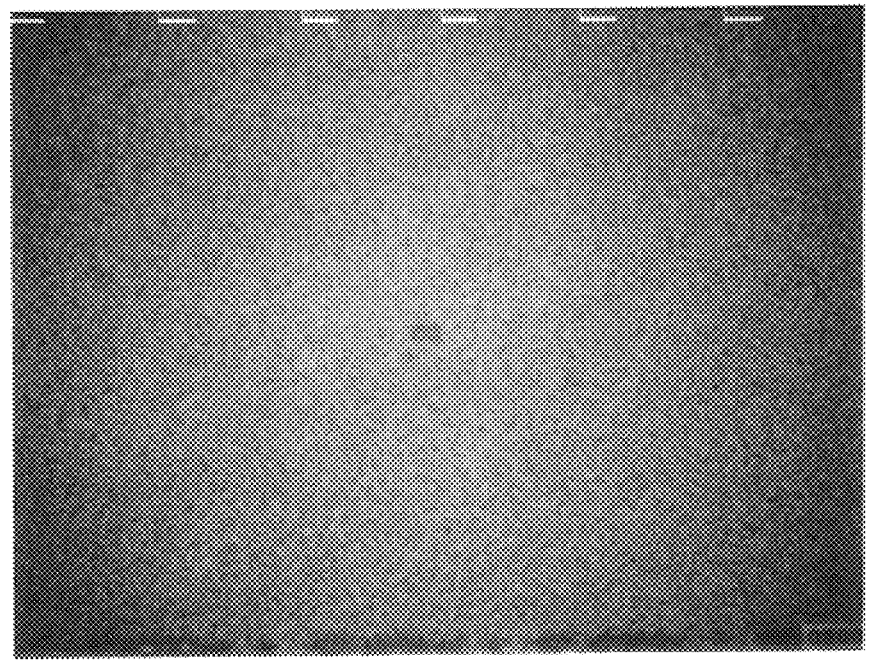
FIG. 23  |—————| 10 μm
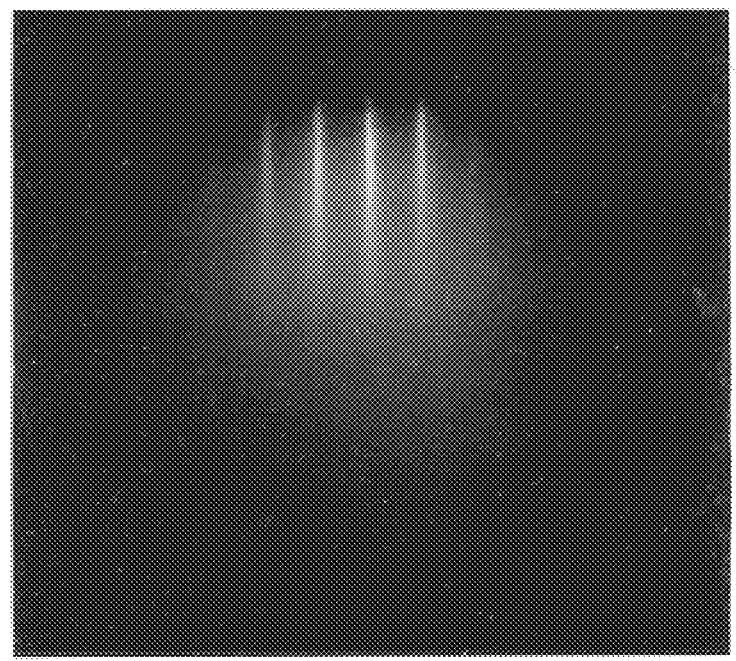
FIG. 24

5V/div

5V/div

FERROELECTRIC THIN FILM, ELECTRIC DEVICE AND METHOD FOR PREPARING FERROELECTRIC THIN FILM

This is a division of application Ser. No. 08/524,809 filed on Sep. 7, 1995, pending.

BACKGROUND OF THE INVENTION

1. Technical Field

This invention relates to a ferroelectric thin film, especially a ferroelectric thin film formed on a semiconductor crystal substrate for use as electronic devices including dielectric memories and semiconductor devices such as non-volatile memories, infrared sensors, optical modulators, optical switches, and OEIC (opto-electronic integrated circuits), and a method for preparing the same. It also relates to electronic devices.

2. Background Art

Electronic devices have been elaborated which are fabricated by forming dielectric films on silicon substrates or semiconductor crystal substrates, followed by integration. Studies have been made to fabricate LSIs having a higher degree of integration and dielectric isolated LSIs relying on SOI technology, by combining semiconductors with dielectrics. Since non-volatile memories, infrared sensors, optical modulators, optical switches, OEIC (opto-electronic integrated circuits) or the like can be fabricated using ferroelectrics which are one class of dielectrics, active research works have been made on the ferroelectric thin film material. Non-volatile memories can be implemented by combining the polarization inversion phenomenon of ferroelectrics with semiconductor devices.

The ferroelectric materials which are currently under consideration because of their superior polarizability include lead family oxide thin films such as $PbTiO_3$, PZT, and PLZT and bismuth family oxide thin films such as $Bi_2Ti_2NbO_9$. These thin film materials must be crystallized in order to exhibit ferroelectric characteristics. For crystallization, a technique of raising the temperature during thin film formation to 600° C. or higher or a technique of annealing at 600° C. or higher after thin film formation is described in Jpn. J. Appl. Phys., 31, (1992) 3029, Jpn. J. Appl. Phys., 33, (1994) 5244, and Mat. Res. Soc. Sympo. Proc., 310, (1993) 473. Lead and bismuth oxides, however, are difficult to control their composition since they have a high vapor pressure and can evaporate during heat treatment at high temperature to induce a compositional deviation. The ferroelectric thin film material should, of course, have superior polarization characteristics, but is also required to have stability at high temperature in that oxides of constituent elements of the ferroelectric material have a low vapor pressure when the reproducibility and mass producibility of semiconductor devices such as memories which are fabricated by applying a semiconductor process to the thin film material are taken into account.

Also devised was a memory of the structure using ferroelectric material in the gate of FET which is one of non-volatile memories. As described in a technical report issued by the Japanese Electronic Information Communication Society, SDM 93-136, ICD 93-130, (1993-11), page 53, the memory using ferroelectric material in the gate has not reached the practically acceptable level because there remain many outstanding problems associated with their manufacture and the physical properties of ferroelectric thin films. For this type of memory, it is ideal, but difficult to implement a metal-ferroelectric-semiconductor (MFS) structure in the memory cell and therefore, a metal-ferroelectric-insulator-semiconductor (MFIS) structure or metal-ferroelectric-metal-insulator-semiconductor (MFMIS) structure must be fabricated. In order that the ferroelectric material undergoes polarization inversion to ensure memory operation for this structure, a sufficient electric field must be applied across the ferroelectric material. Since the ferroelectric material and insulator are formed in series as capacitors in the MFIS and MFMIS structures, it is necessary to take appropriate measures for lowering the dielectric constant of ferroelectric material and raising the dielectric constant of insulator in order that a sufficient electric field be applied across the ferroelectric material. Among the ferroelectric materials which have been heretofore investigated, lead family oxide thin films such as $PbTiO_3$, PZT, and PLZT have a dielectric constant as high as 400 to 1,000 or more. There is a desire to have a ferroelectric thin film having a low dielectric constant.

It is also desired to use a single crystal as the dielectric material in order to ensure optimum device characteristics and reproducibility thereof. Polycrystalline material is difficult to provide satisfactory device characteristics due to disturbance of physical quantities by grain boundary. This is also true for thin film materials and a dielectric epitaxial film which is as close to a complete single crystal as possible is desired. In order to implement a dielectric epitaxial film in the above-mentioned MFIS structure or MFMIS structure, a metal and a ferroelectric material must be epitaxially grown on a single crystal silicon substrate which is a semiconductor substrate, which has not been accomplished.

Furthermore, although the MFMIS structure needs a satisfactory metal electrode film, a single crystal silicon substrate having a conductive epitaxial film of (111) orientation, for example, is not available in the prior art.

Among conventional lead and bismuth family materials, there are available no thin films free of a compositional deviation and closer to a single crystal. High reactivity with silicon serving as the substrate allows for diffusion of Pb or Bi into the silicon substrate, which has serious influence on the characteristics of integrated circuits fabricated in the silicon substrate. Therefore, there is a desire to have a ferroelectric thin film material other than the lead and bismuth families. For the above-mentioned application as a memory of the structure using ferroelectric material in the gate of FET, there are available at present no ferroelectric thin film materials having a low dielectric constant.

DISCLOSURE OF THE INVENTION

A primary object of the present invention is to overcome the above-mentioned problems by using a ferroelectric thin film having a low dielectric constant, exhibiting polarization characteristics, and having a consistent composition and high crystallinity which are not achievable with prior art lead and bismuth families. Another object of the present invention is to provide a ferroelectric thin film which allows a MFIS structure and MFMIS structure to be implemented with all epitaxial films if an epitaxial ferroelectric film and an epitaxial metal film are obtained, an electronic device, and a method for preparing the ferroelectric thin film.

A further object of the present invention is to provide an electronic device having a conductive epitaxial film of (111) orientation on a single crystal silicon substrate.

The inventors have found that these problems are solved by using a crystallized thin film of a material of $YMnO_3$ family.

More particularly, these objects are achieved by the present invention which is defined below as (1) to (19).

(1) A ferroelectric thin film formed on a substrate, having a YMnO$_3$ hexagonal crystal structure, composed mainly of a rare earth element A (inclusive of scandium and yttrium), manganese and oxygen, and c-plane oriented parallel to the substrate surface.

(2) The ferroelectric thin film of (1) which is an epitaxial film.

(3) The ferroelectric thin film of (1) wherein said substrate comprises a semiconductor.

(4) The ferroelectric thin film of (3) wherein said semiconductor is a single crystal.

(5) The ferroelectric thin film of (4) wherein said semiconductor single crystal is a silicon single crystal whose (100) or (111) plane constitutes the substrate surface.

(6) The ferroelectric thin film of (1) wherein the atomic composition ratio of A/Mn ranges from 0.8/1 to 1.2/1.

(7) The ferroelectric thin film of (4) wherein at least one epitaxial oxide layer is provided between said ferroelectric thin film and said semiconductor single crystal substrate, said oxide layer being composed mainly of at least one oxide of a rare earth element (inclusive of scandium and yttrium), zirconium oxide or zirconium oxide stabilized with a rare earth element (inclusive of scandium and yttrium).

(8) The ferroelectric thin film of (5) wherein at least one conductive epitaxial layer is provided between said ferroelectric thin film and said semiconductor single crystal substrate.

(9) The ferroelectric thin film of (7) wherein at least one conductive epitaxial layer is provided between said epitaxial oxide layer and said semiconductor single crystal substrate.

(10) The ferroelectric thin film of (8) wherein said conductive epitaxial layer is formed of a metal or conductive metal oxide.

(11) The ferroelectric thin film of (10) wherein said metal comprises at least one member selected from the group consisting of Pt, Ir, Os, Re, Pd, Rh, and Ru and said conductive metal oxide is an indium-containing oxide or a perovskite type oxide.

(12) The ferroelectric thin film of (9) wherein said conductive epitaxial layer is formed of a metal or conductive metal oxide.

(13) The ferroelectric thin film of (12) wherein said metal comprises at least one member selected from the group consisting of Pt, Ir, Os, Re, Pd, Rh, and Ru and said conductive metal oxide is an indium-containing oxide or a perovskite type oxide.

(14) An electronic device comprising a ferroelectric thin film as set forth in any one of (1) to (13).

(15) An electronic device comprising
    a silicon single crystal substrate having (100) or (111) plane as a substrate surface, and
    a conductive epitaxial layer of (111) orientation formed on the substrate surface.

(16) The electronic device of (15) wherein said conductive epitaxial layer is formed of a metal or conductive metal oxide.

(17) The electronic device of (16) wherein said metal comprises at least one member selected from the group consisting of Pt, ir, Os, Re, Pd, Rh, and Ru and said conductive metal oxide is an indium-containing oxide or a perovskite type oxide.

(18) The electronic device of (15) wherein at least one epitaxial layer composed mainly of at least one oxide of a rare earth element (inclusive of scandium and yttrium), zirconium oxide or zirconium oxide stabilized with a rare earth element (inclusive of scandium and yttrium) is provided between said substrate and said conductive epitaxial layer.

(19) A method for preparing a ferroelectric thin film formed on a substrate, having a YMnO$_3$ hexagonal crystal structure of, and composed mainly of a rare earth element (inclusive of scandium and yttrium), manganese and oxygen, said method comprising carrying out in a vacuum chamber the steps of heating a substrate, introducing an oxidizing gas into the vacuum chamber, and supplying manganese and a rare earth element (inclusive of scandium and yttrium) to the substrate surface by evaporation, thereby forming on the substrate surface the ferroelectric thin film which is c-plane oriented parallel to the substrate surface.

FUNCTION AND EFFECT

The oxide thin film of the present invention uses a material of YMnO$_3$ family as a ferroelectric material. As described in Landolt-Bornstein, Vol. 16 which is a data collection of ferroelectric materials, various composition families centering YMnO$_3$ have been investigated in bulk material form. The present inventors first succeeded in forming thin films of these materials and discovered that if a crystallized film is of c-plane orientation, ferroelectric characteristics are obtained in a film thickness direction. Since the material of YMnO$_3$ family is an oxide containing a rare earth element (inclusive of scandium and yttrium) and manganese, the constituent elements have a low vapor pressure unlike the lead and bismuth family materials which have heretofore been under consideration. Consequently, there occurs little composition deviation when a crystallized thin film is prepared from this material.

The ferroelectric thin film of the invention can be prepared on a substrate directly or by interposing an intermediate layer therebetween. Crystals of YMnO$_3$ family are hexagonal and especially when a silicon single crystal is used as the substrate, has very good lattice matching with silicon (111) plane. The use of an epitaxial film composed mainly of an oxide of a rare earth element (inclusive of scandium and yttrium), zirconium oxide or zirconium oxide stabilized with a rare earth element (inclusive of scandium and yttrium) as the intermediate layer formed on (111) plane or (100) plane ot a silicon substrate prevents the ferroelectric thin film from stripping and ensures good lattice matching between the ferroelectric thin film and the intermediate layer. The intermediate layer also permits a metal electrode thin film to be epitaxially formed thereon. The conductive epitaxial film, when used, functions as an electrode (M) beneath the ferroelectric film (F) and has good lattice matching with the intermediate layer. Therefore, the ferroelectric thin film material of the invention can be epitaxially grown on a silicon substrate to form a high crystallinity thin film. Owing to its high crystallinity, ferroelectric characteristics are superior. Since its dielectric constant is as low as about 40, it is suitable for the application as memories of the structure using ferroelectrics as the gate of FET. There is obtained a thin film best suited for MFIS and MFMIS structures which are basic memory structures.

substrate, illustrating a RHEED pattern, that is a diffraction pattern resulting from an electron beam incident from silicon single crystal [110] direction.

Figure 3:
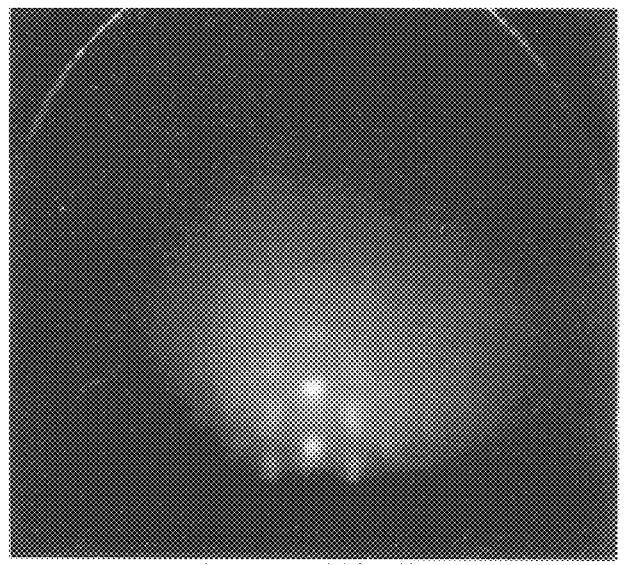

FIG. 3 is a drawing-substituting photograph showing the surface structure of a $YbMnO_3$ film formed on a Si (111) substrate, illustrating a RHEED pattern, that is a diffraction pattern resulting from an electron beam incident from silicon single crystal [110] direction.

Figure 4:
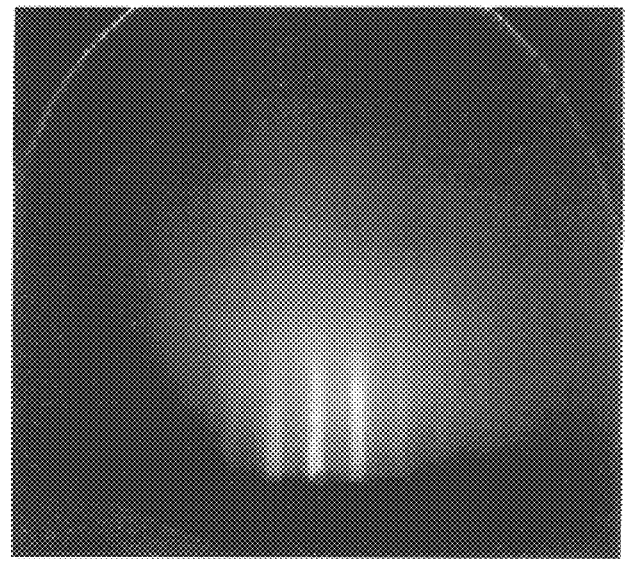

FIG. 4 is a drawing-substituting photograph showing the surface structure of a $HoMnO_3$ film formed on a Si (111) substrate, illustrating a RHEED pattern, that is a diffraction pattern resulting from an electron beam incident from silicon single crystal [110] direction.

Figure 5:
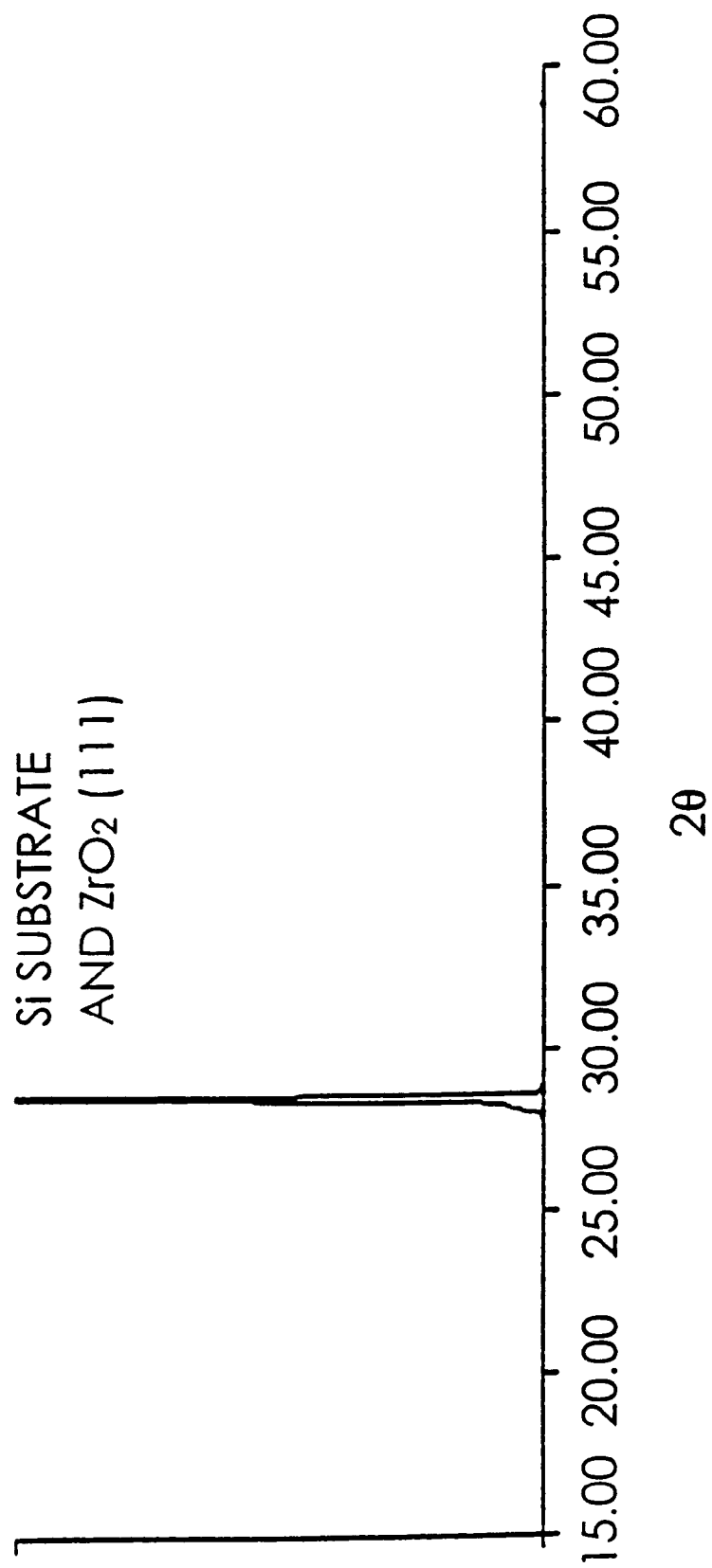

FIG. 5 is an X-ray diffraction diagram showing the film structure of $ZrO_2$ formed on a Si (111) substrate.

Figure 6:
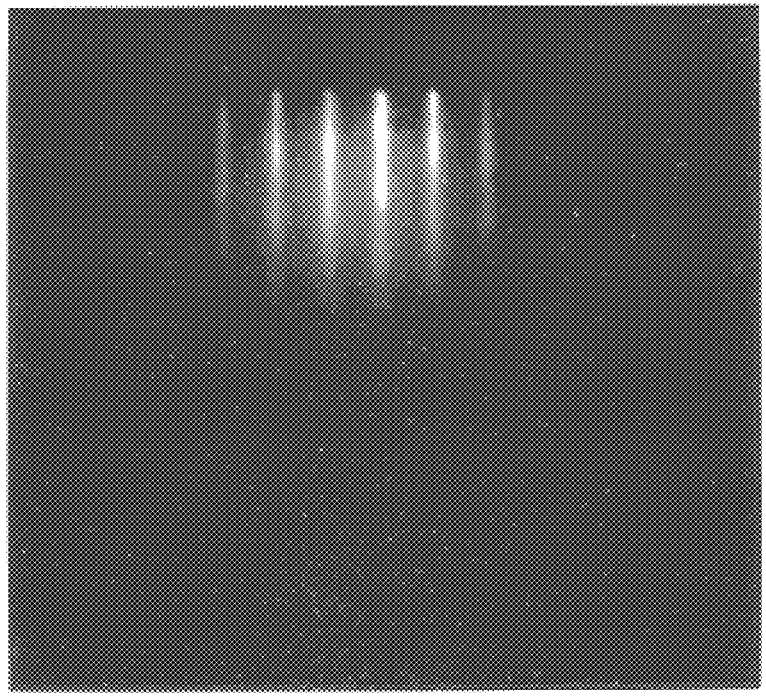

FIG. 6 is a drawing-substituting photograph showing the crystal structure of $ZrO_2$ formed on a Si (111) substrate, illustrating a RHEED diffraction pattern resulting from an electron beam incident from silicon single crystal [110] direction.

Figure 7:
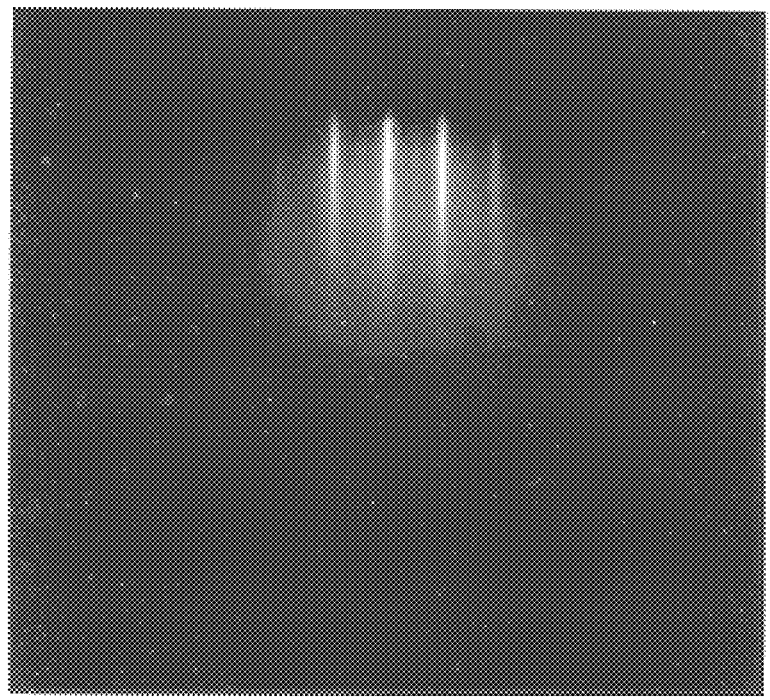

FIG. 7 is a drawing-substituting photograph showing the crystal structure of $MnO_3$ formed on a Si (111) substrate via a $ZrO_2$ layer, illustrating a RHEED diffraction pattern resulting from an electron beam incident from silicon single crystal [110] direction.

Figure 8:
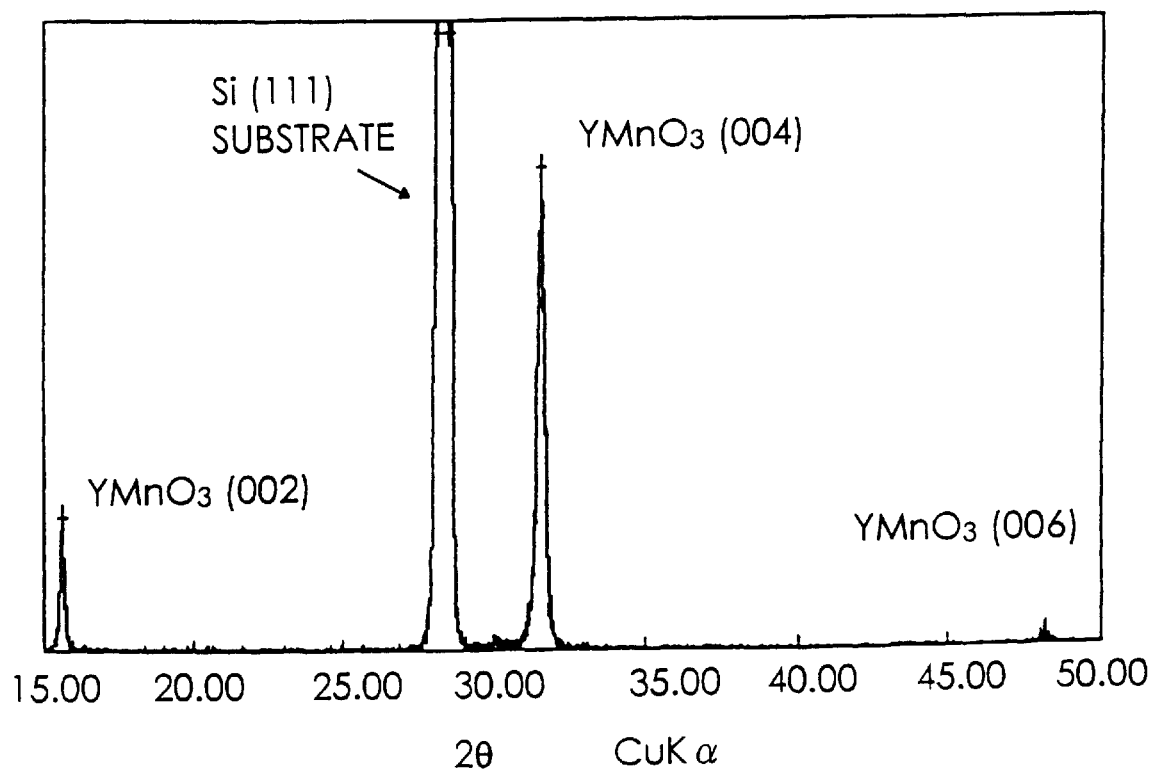

FIG. 8 is an X-ray diffraction diagram of a $YMnO_3$ film formed on $ZrO_2$ (111)/Si (111) substrate.

Figure 9:
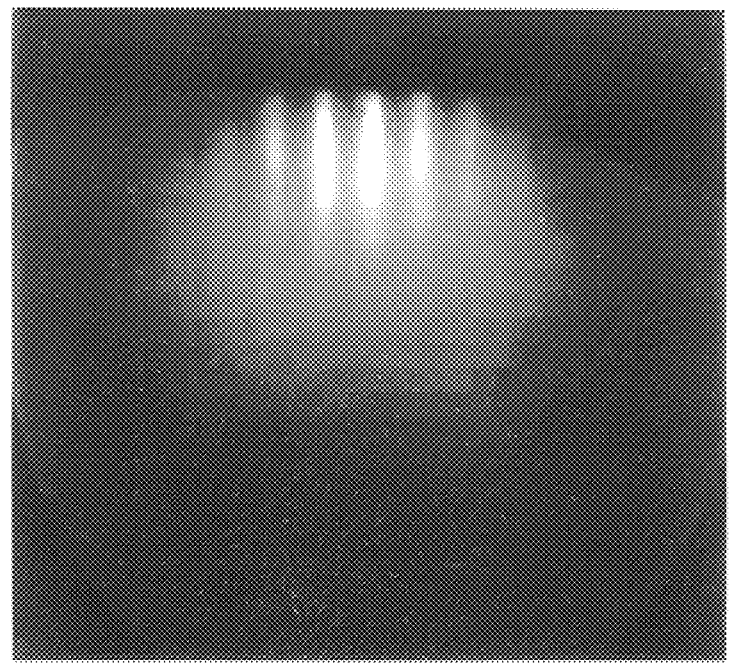

FIG. 9 is a drawing-substituting photograph showing the crystal structure of $Y_2O_3$ formed on a Si (111) substrate, illustrating a RHEED diffraction pattern resulting from an electron beam incident from silicon single crystal [110] direction.

Figure 10:
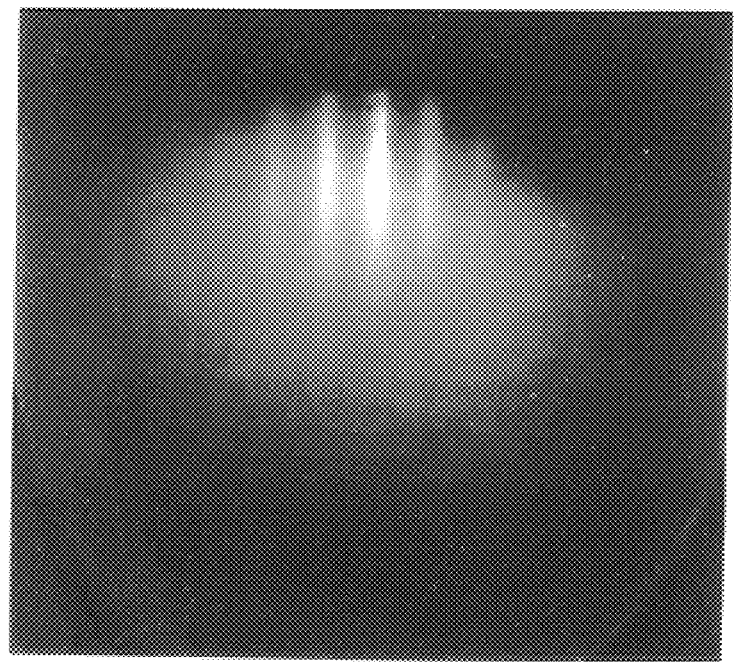

FIG. 10 is a drawing-substituting photograph showing the crystal structure of $YMnO_3$ formed on $Y_2O_3$ (111)/Si (111) substrate, illustrating a RHEED diffraction pattern resulting from an electron beam incident from silicon single crystal [110] direction.

Figure 11:
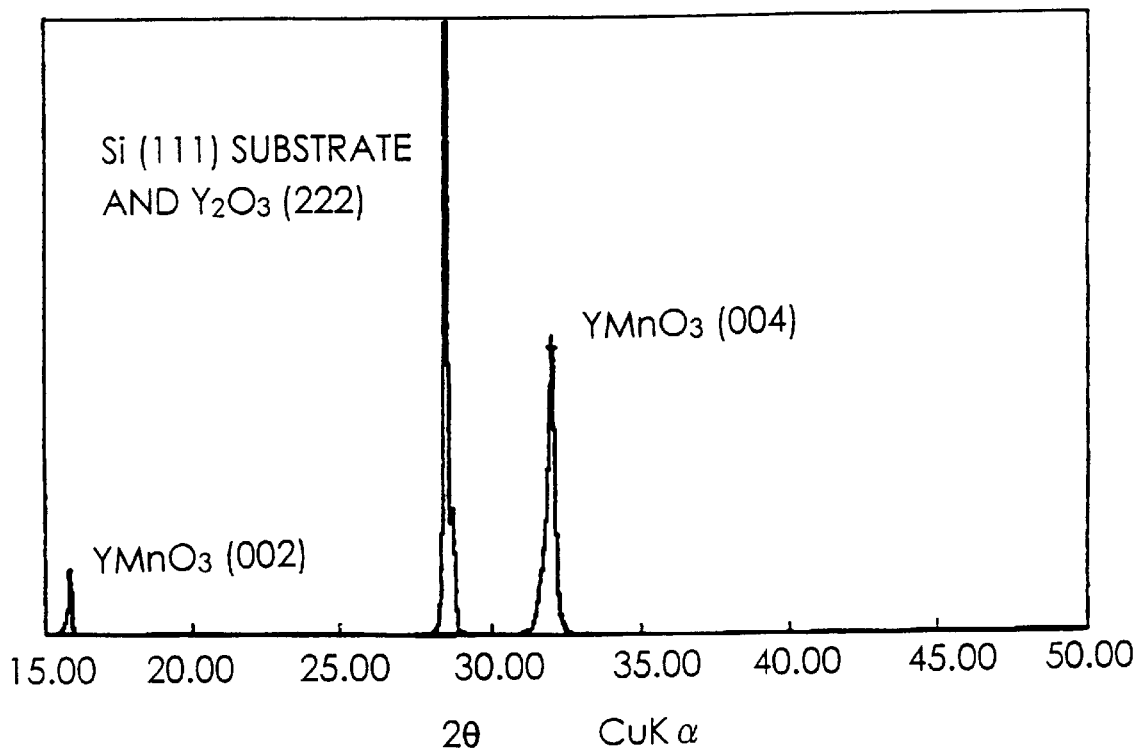

FIG. 11 is an X-ray diffraction diagram showing the film structure of $YMnO_3$ formed on $Y_2O_3$ (111)/Si (111) substrate.

Figure 12:
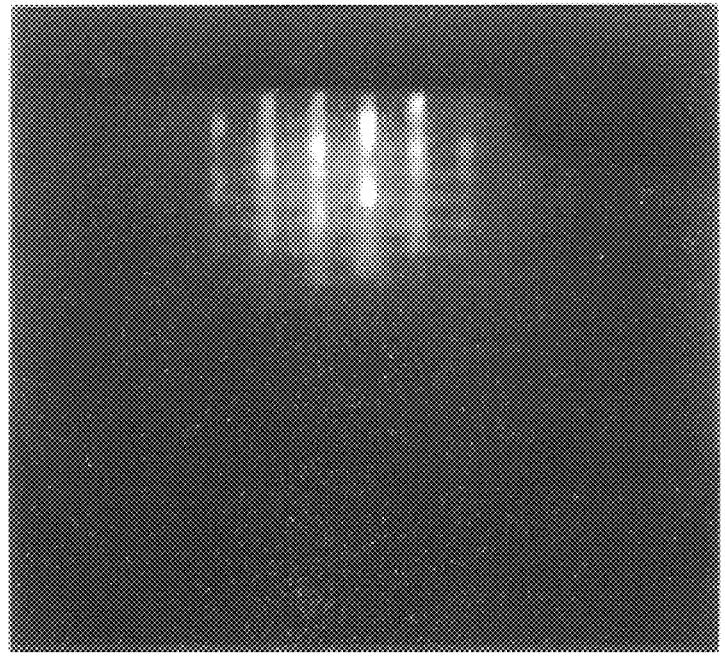

FIG. 12 is a drawing-substituting photograph showing the crystal structure of $Y_2O_3$ formed on a silicon (100) substrate, illustrating a RHEED diffraction pattern resulting from an electron beam incident from silicon single crystal [110] direction.

Figure 13:
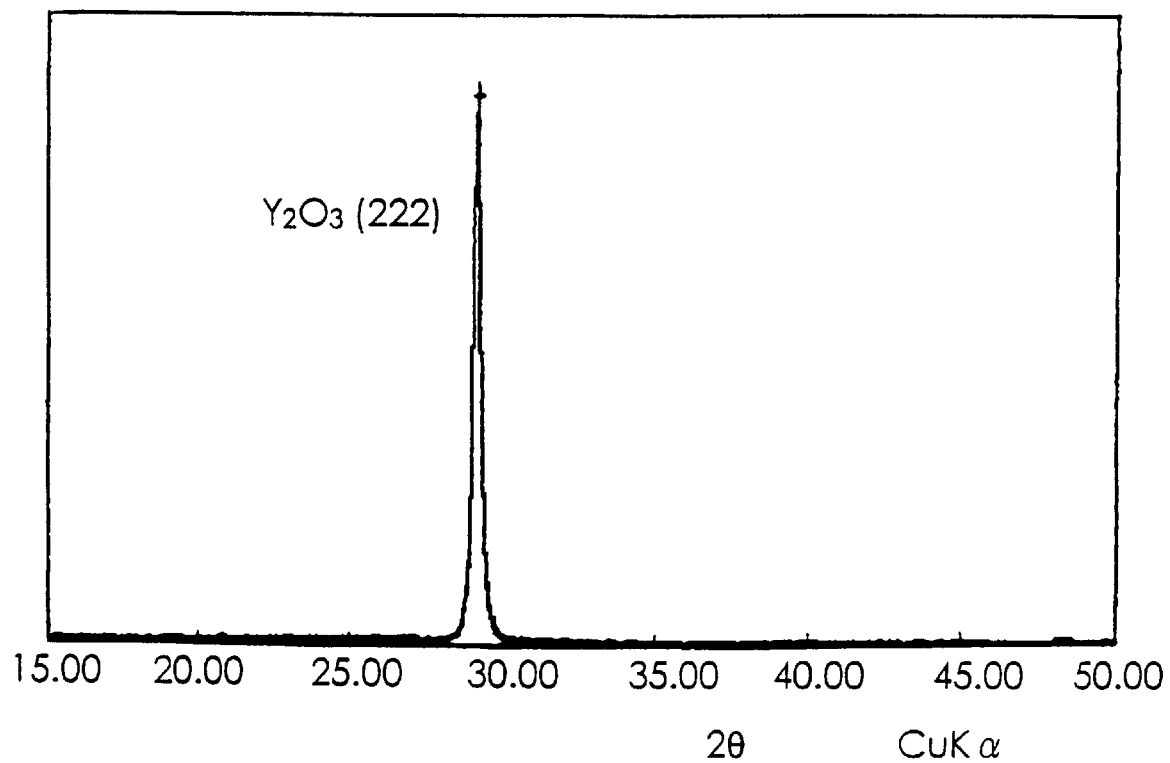

FIG. 13 is an X-ray diffraction diagram showing the film structure of $Y_2O_3$ formed on a silicon (100) substrate.

Figure 14:
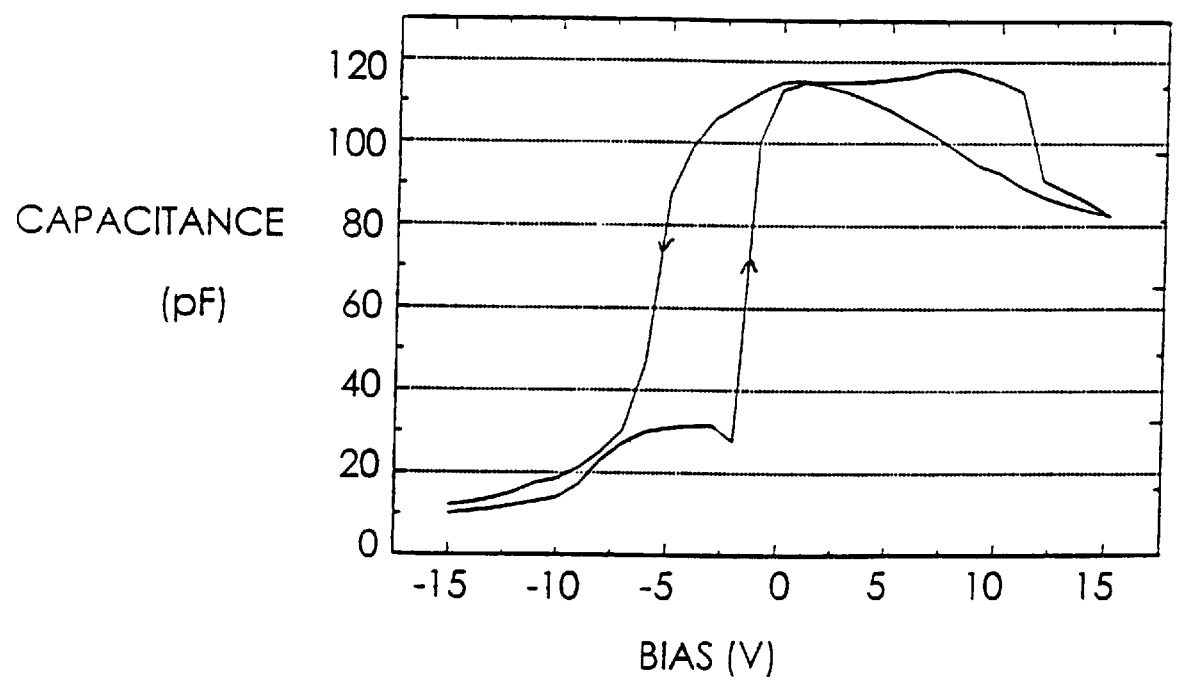

FIG. 14 is a C-V curve of a MFIS structure using a $HoMnO_3$ ferroelectric film.

Figure 15:
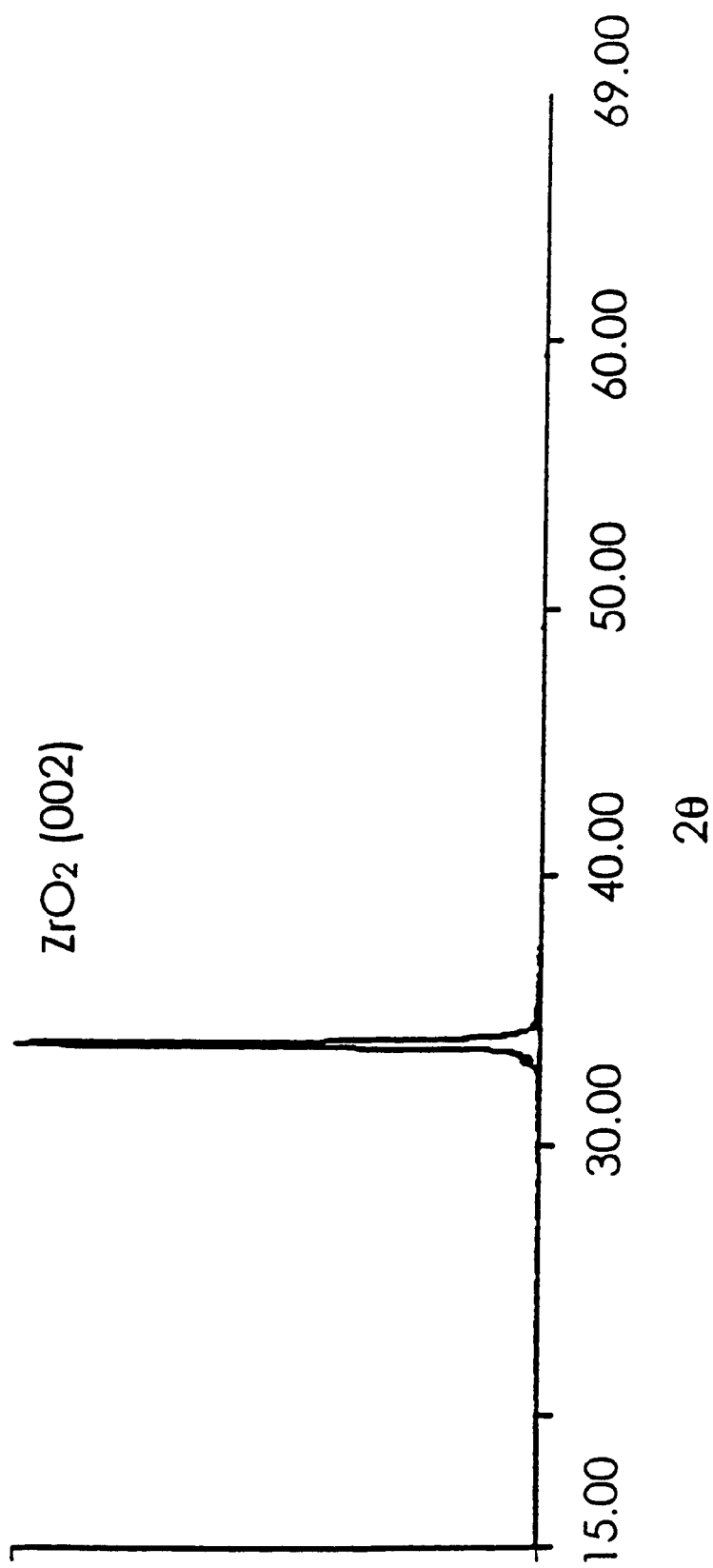

FIG. 15 is an X-ray diffraction diagram showing the film structure of $ZrO_2$ formed on a silicon (100) substrate.

Figure 16:
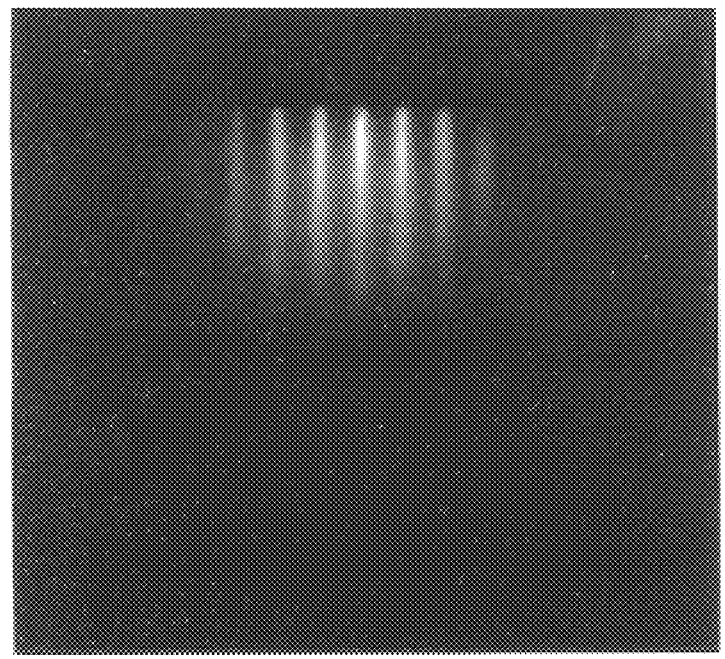

FIG. 16 is a drawing-substituting photograph showing the crystal structure of $ZrO_2$ formed on a silicon (100) substrate, illustrating a RHEED diffraction pattern resulting from an electron beam incident from silicon single crystal [110] direction.

Figure 17:
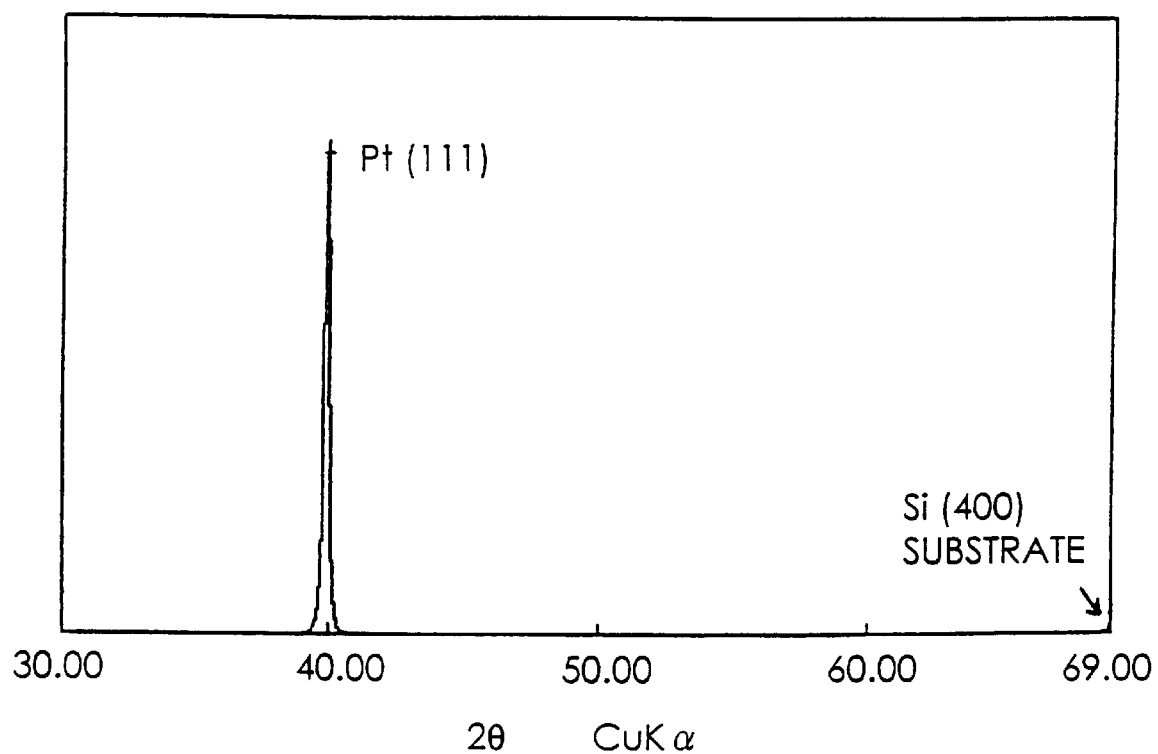

FIG. 17 is an X-ray diffraction diagram of a Pt film formed on $ZrO_2$ (001)/Si (100) substrate.

Figure 18:
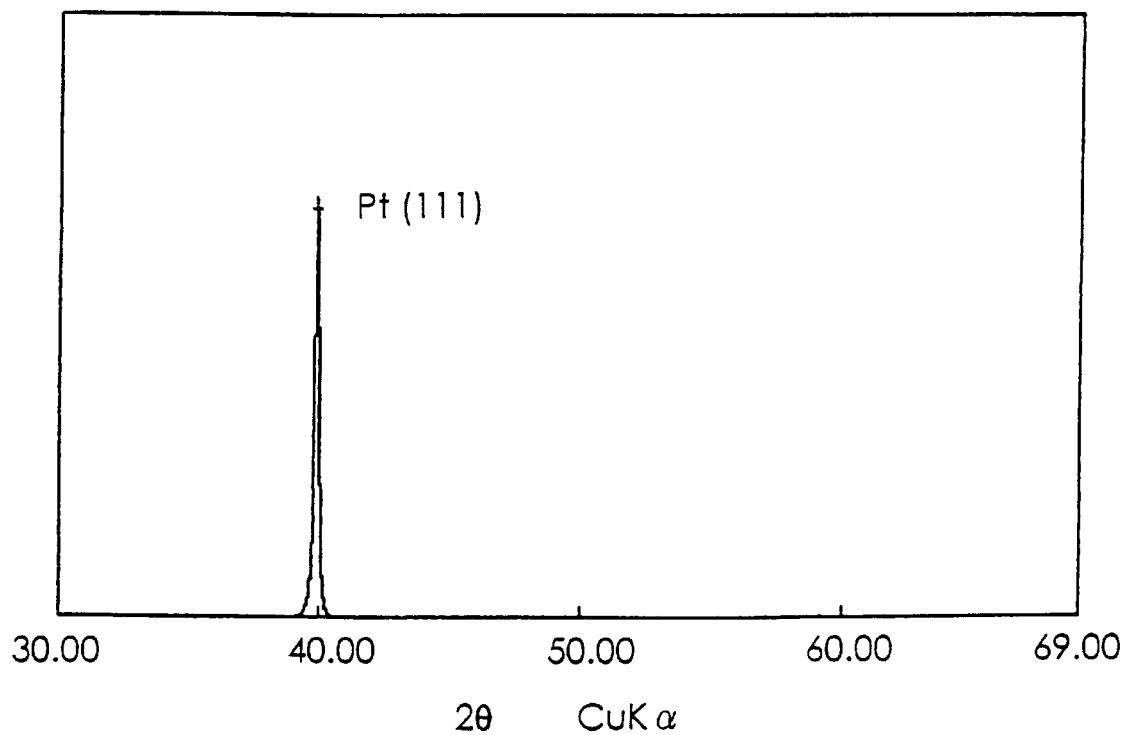

FIG. 18 is an X-ray diffraction diagram of a Pt film formed on $ZrO_2$ (111)/Si (111) substrate.

Figure 19:
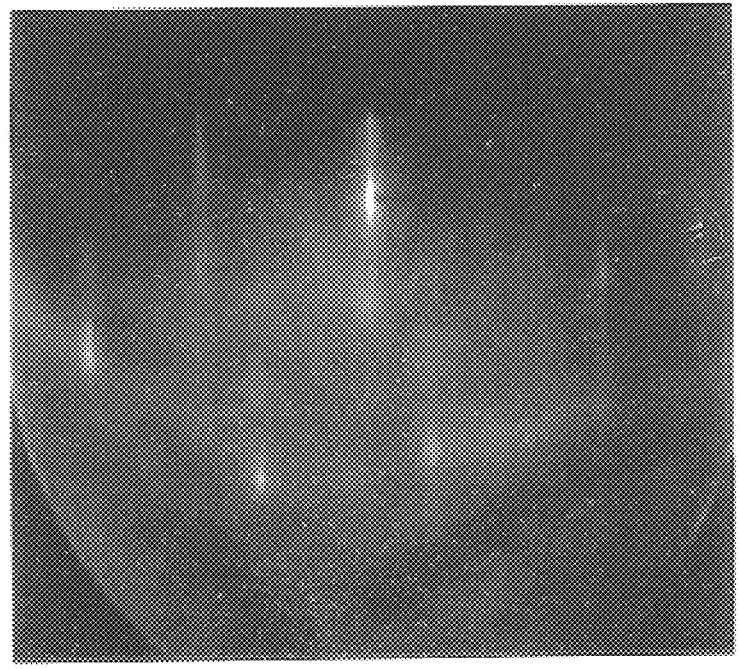

FIG. 19 is a drawing-substituting photograph showing the crystal structure of a Pt film formed on $ZrO_2$ (111)/Si (100) substrate, illustrating a RHEED diffraction pattern resulting from an electron beam incident from silicon single crystal [110] direction.

Figure 20:
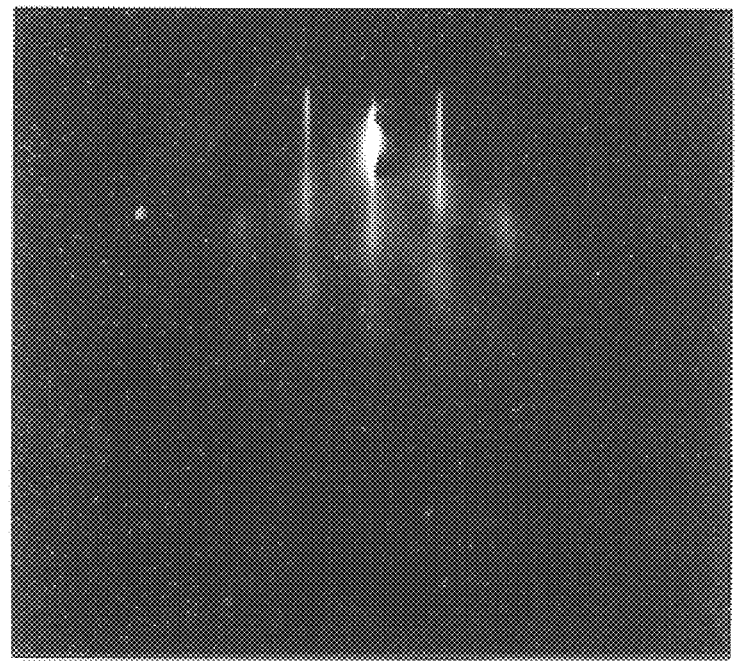

FIG. 20 is a drawing-substituting photograph showing the crystal structure of a Pt film formed on $ZrO_2$ (111)/Si (111) substrate, illustrating a RHEED diffraction pattern resulting from an electron beam incident from silicon single crystal [110] direction.

Figure 21:
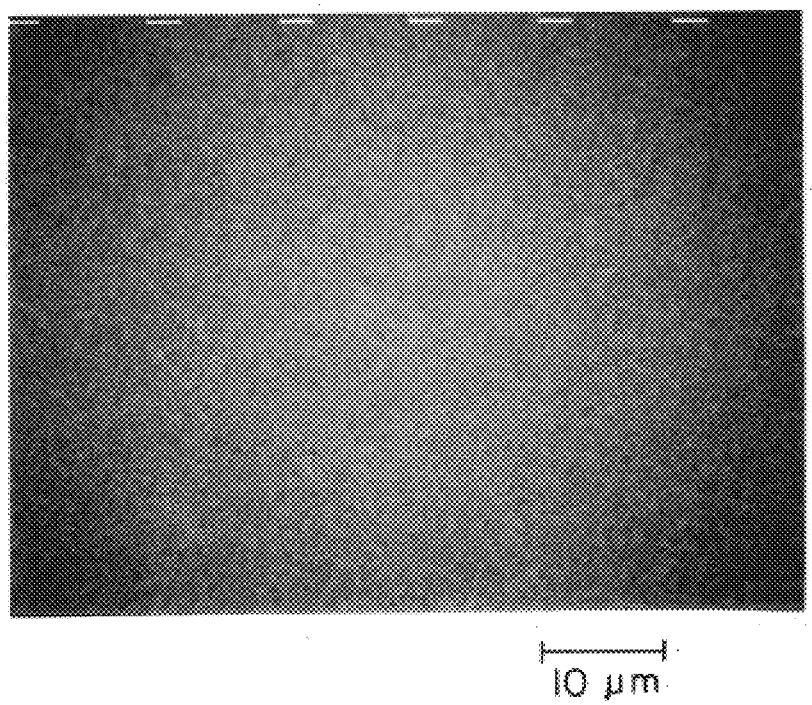

FIG. 21 is a photomicrograph showing the surface of a Pt film formed on $ZrO_2$ (001)/Si (100) substrate.

Figure 22:
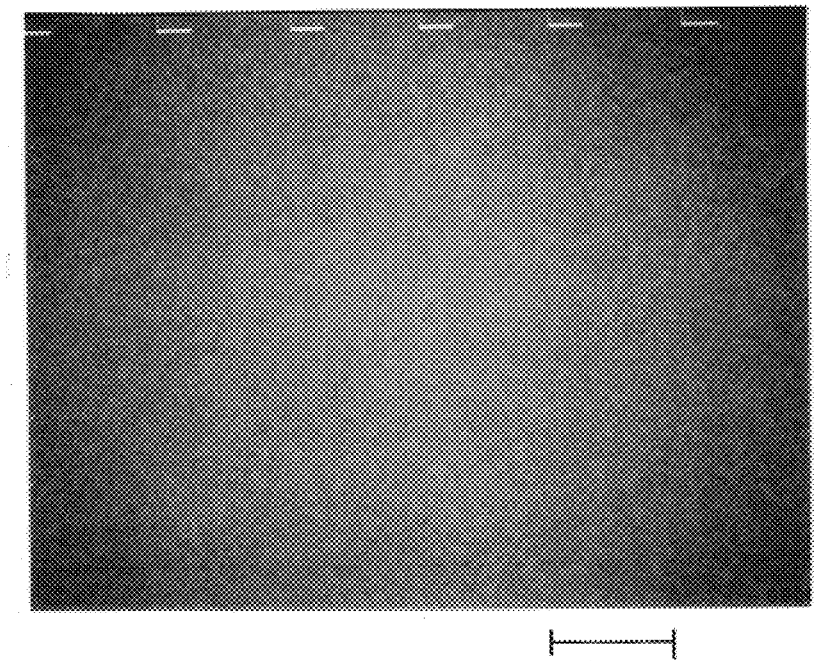

FIG. 22 is a photomicrograph showing the surface of a Pt film formed on $ZrO_2$ (111)/Si (111) substrate.

FIG. 23 is a photomicrograph showing the surface of a Ir film formed on $ZrO_2$ (111)/Si (111) substrate.

FIG. 24 is a drawing-substituting photograph showing the crystal structure of $YMnO_3$ formed on Pt (111)/$ZrO_2$ (111)/ Si (111) substrate illustrating A RHEED diffraction pattern resulting from an electron beam incident from silicon single crystal [110] direction.

Figure 25:
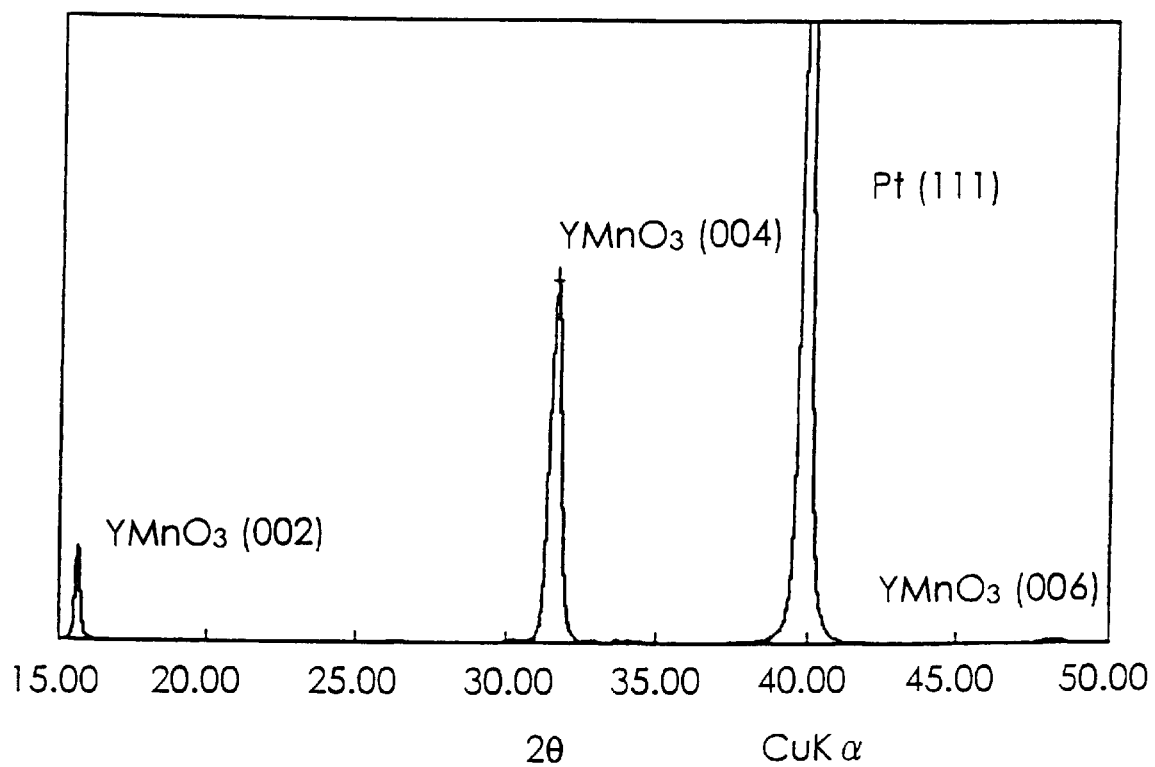

FIG. 25 is an X-ray diffraction diagram of a $YMnO_3$ film formed on Pt (111)/$ZrO_2$ (001)/Si (100) substrate.

Figure 26:
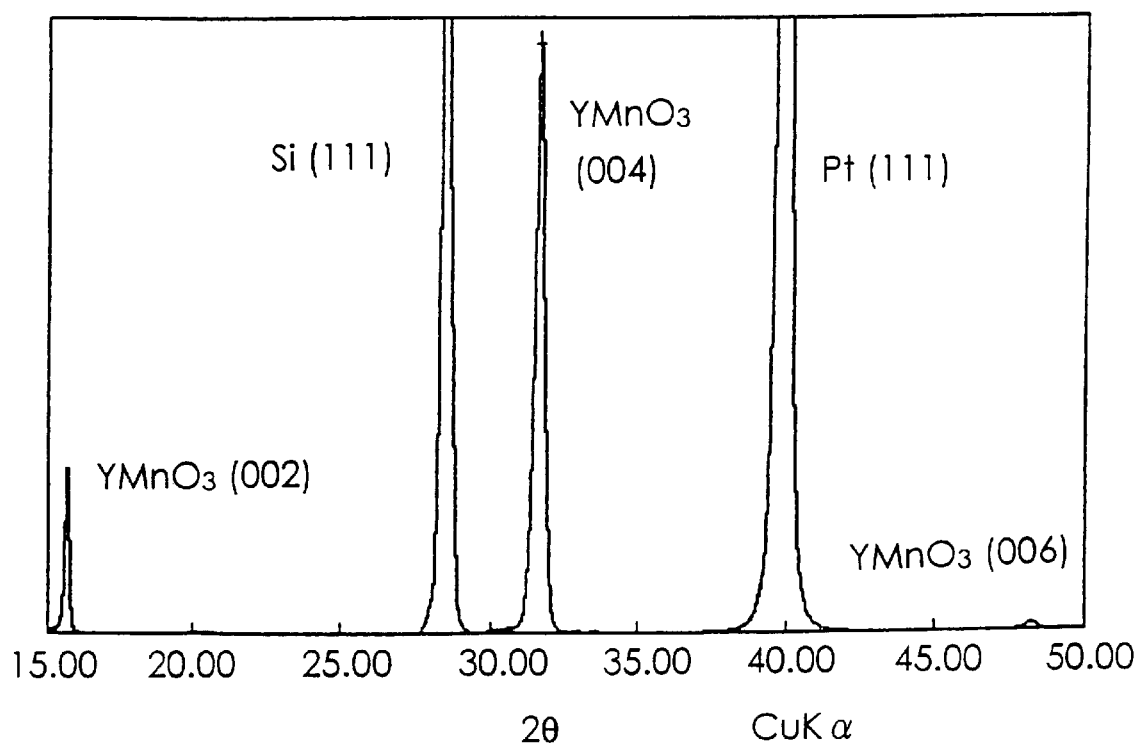

FIG. 26 is an X-ray diffraction diagram of a $YMnO_3$ film formed on Pt (111)/$ZrO_2$ (111)/Si (111) substrate.

Figure 27:
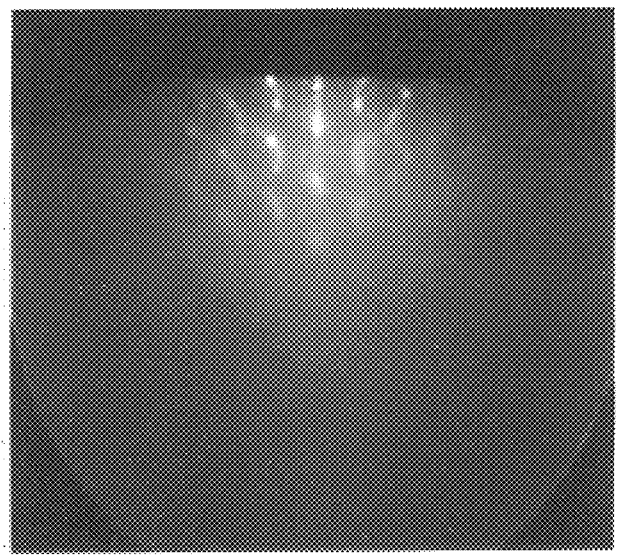

FIG. 27 is a drawing-substituting photograph showing the crystal structure of $HoMnO_3$ formed on Pt (111)/$ZrO_2$ (111)/Si (111) substrate, illustrating a RHEED diffraction pattern resulting from an electron beam incident from silicon single crystal [110] direction.

Figure 28:
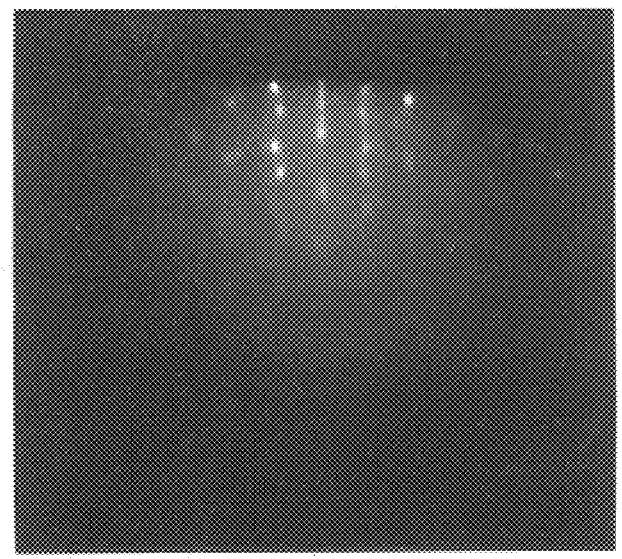

FIG. 28 is a drawing-substituting photograph showing the crystal structure of $ErMnO_3$ formed on Pt (111)/$ZrO_2$ (111)/ Si (111) substrate, illustrating a RHEED diffraction pattern resulting from an electron beam incident from silicon single crystal [110] direction.

Figure 29:
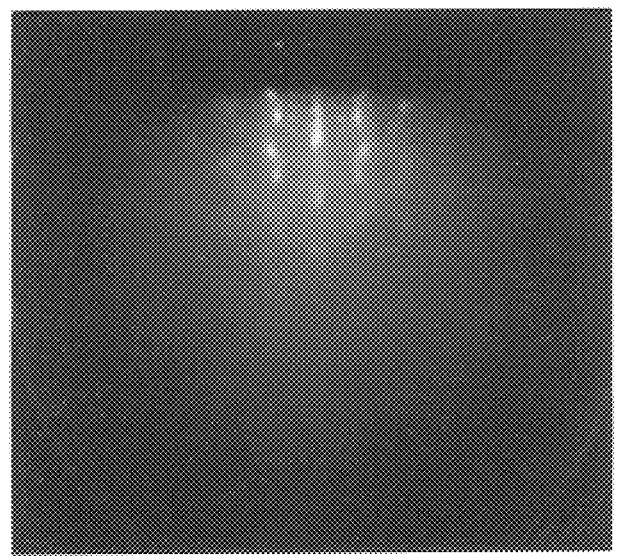

FIG. 29 is a drawing-substituting photograph showing the crystal structure of $YbMnO_3$ formed on Pt (111)/$ZrO_2$ (111)/Si (111) substrate, illustrating a RHEED diffraction pattern resulting from an electron beam incident from silicon single crystal [110] direction.

Figure 30:
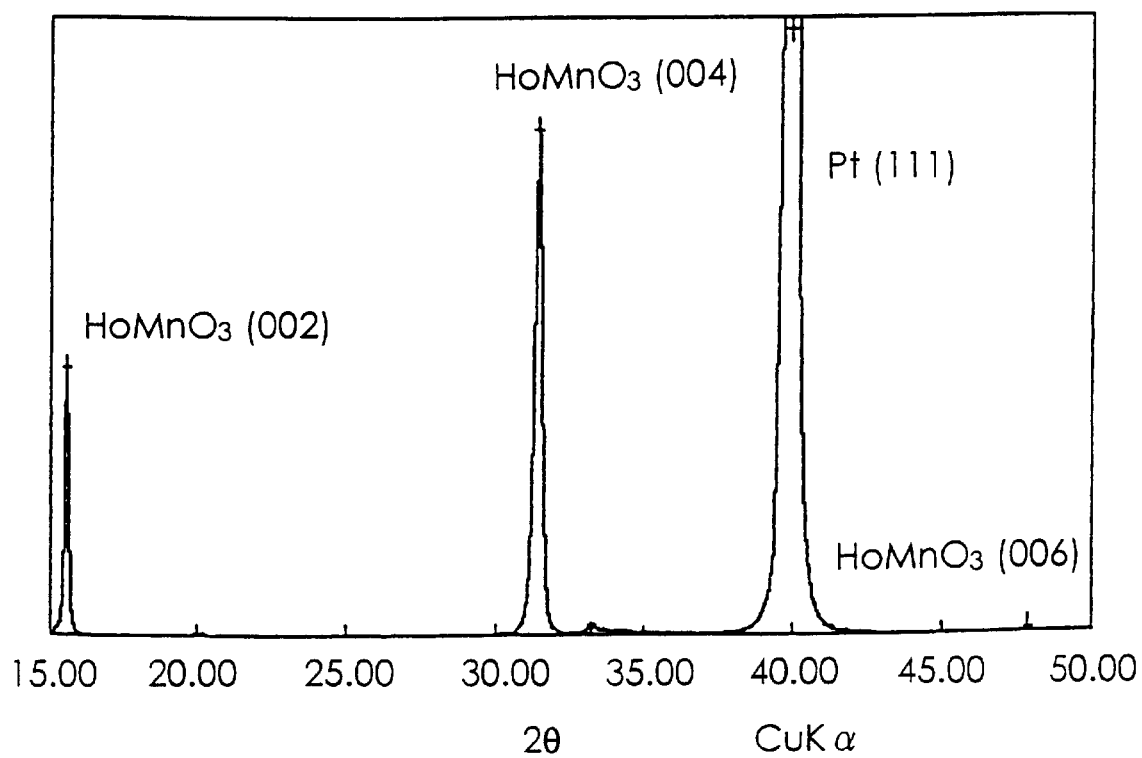

FIG. 30 is an X-ray diffraction diagram of a $HoMnO_3$ film formed on Pt (111)/$ZrO_2$ (111)/Si (111) substrate.

Figure 31:
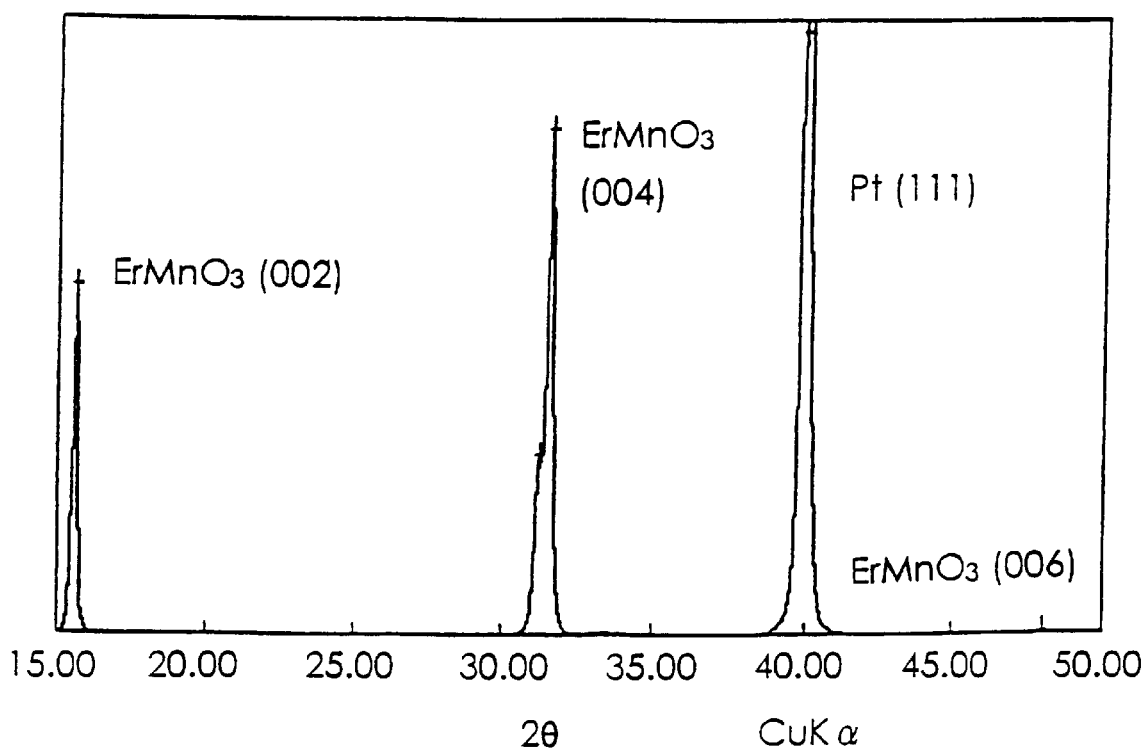

FIG. 31 is an X-ray diffraction diagram of a $ErMnO_3$ film formed on Pt (111)/$ZrO_2$ (111)/Si (111) substrate.

Figure 32:
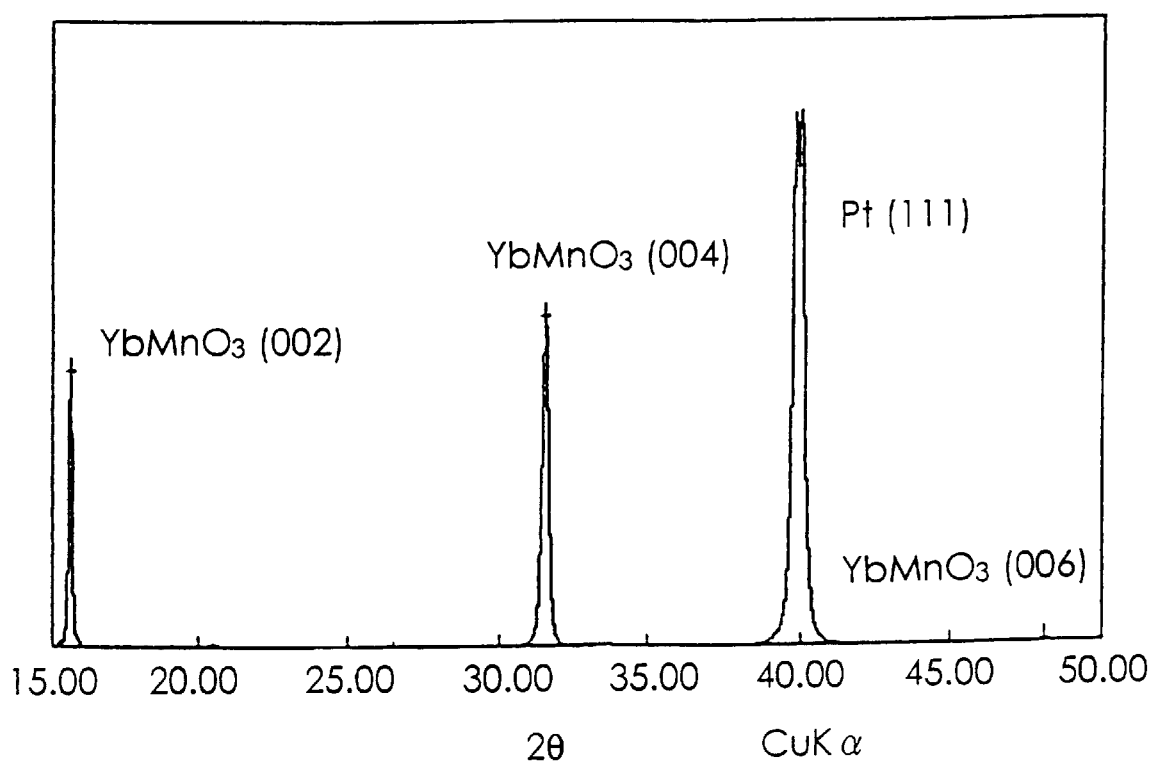

FIG. 32 is an X-ray diffraction diagram of a $YbMnO_3$ film formed on Pt (111)/$ZrO_2$ (111)/Si (111) substrate.

Figure 33:
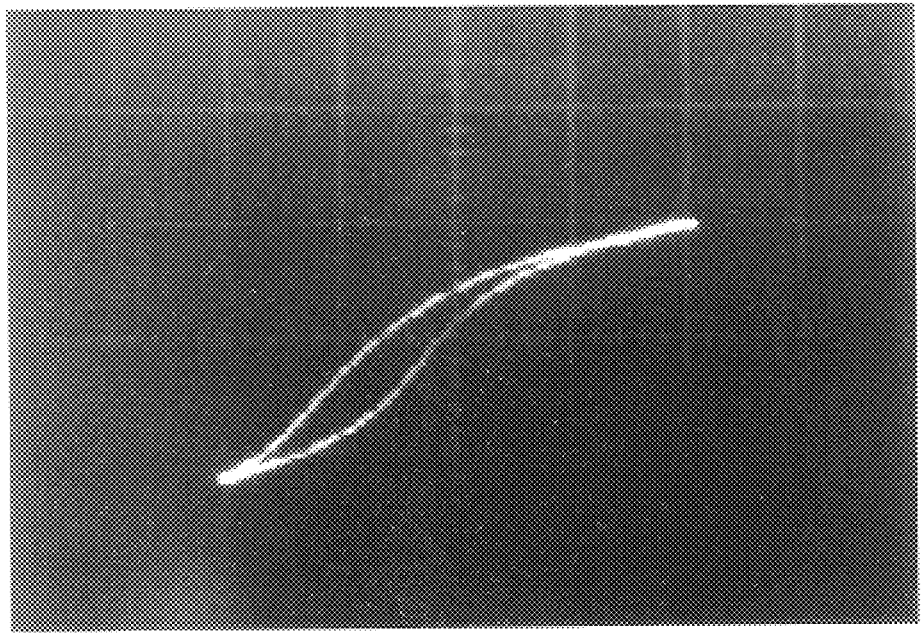

FIG. 33 shows a D-E hysteresis curve of the $YMnO_3$ film formed on Pt (111)/$ZrO_2$ (111)/Si (111) substrate.

Figure 34:
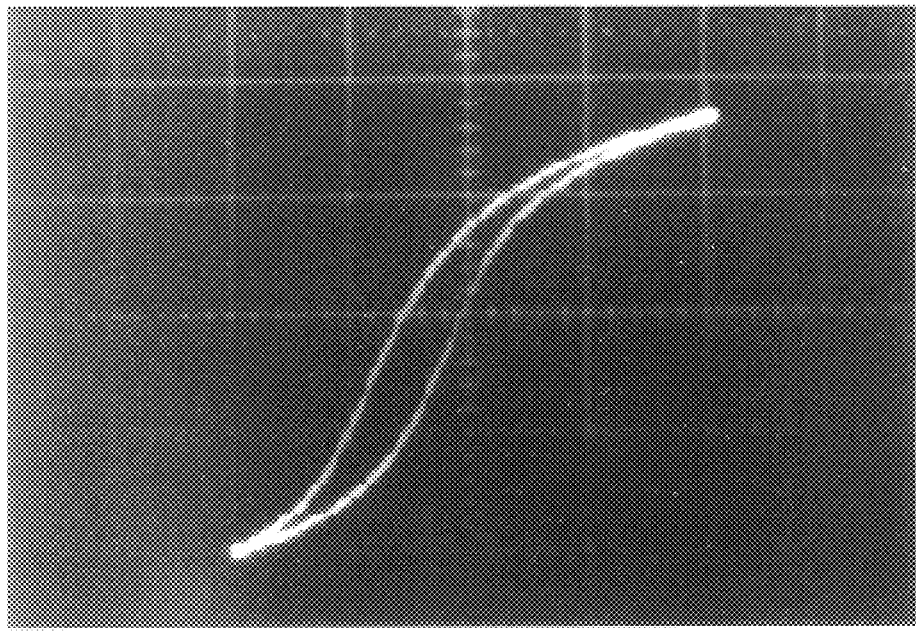

FIG. 34 shows a D-E hysteresis curve of the $ErMnO_3$ film formed on Pt (111)/$ZrO_2$ (111)/Si (111) substrate.

Figure 35:
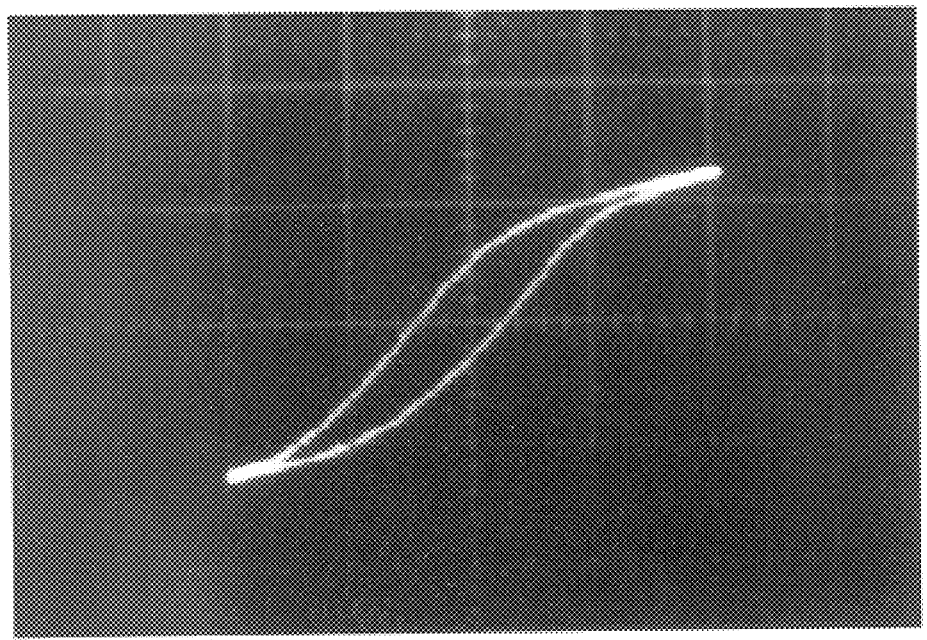

FIG. 35 shows a D-E hysteresis curve of the $HoMnO_3$ film formed on Pt (111)/$ZrO_2$ (111)/Si (111) substrate.

Figure 36:
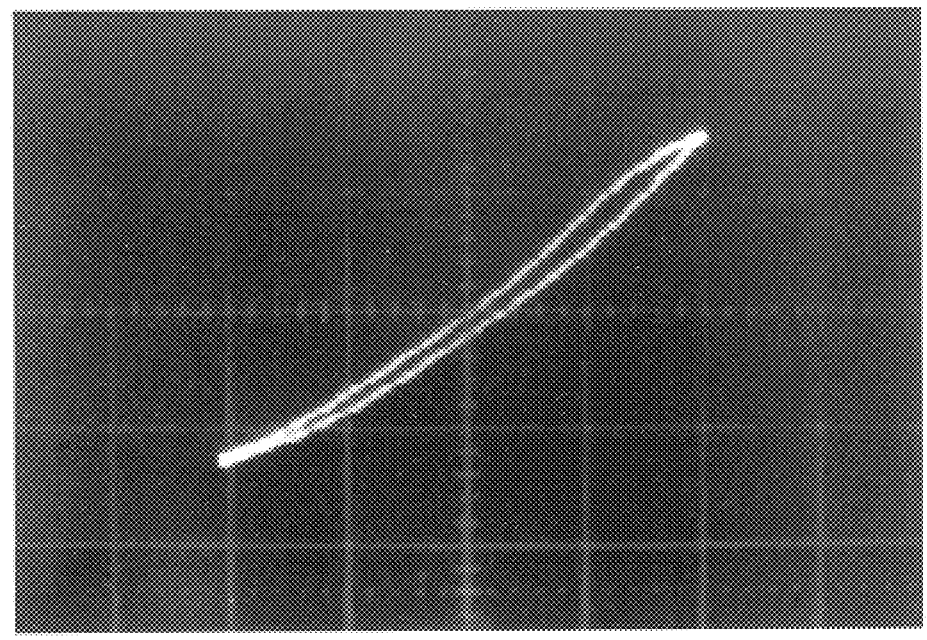

FIG. 36 shows a D-E hysteresis curve of the $YbMnO_3$ film formed on Pt (111)/$ZrO_2$ (111)/Si (111) substrate.

ILLUSTRATIVE CONSTRUCTION

The present invention provides a ferroelectric thin film which is characterized as a c-plane oriented ferroelectric layer formed on a substrate directly or with an intermediate layer interposed between the substrate and the ferroelectric thin film, the ferroelectric layer being made of a $YMnO_3$ family material. The $YMnO_3$ family material is represented by the chemical formula: $AMnO_3$ wherein A is at least one rare earth element (inclusive of scandium and yttrium). In the $YMnO_3$ family material, the compositional ratio of A/Mn preferably ranges from 0.8/1 to 1.2/1, more preferably from 0.9/1 to 1.1/1. This range ensures insulating nature for ferroelectric materials and improves crystallinity and hence, ferroelectric characteristics. In contrast, a compositional ratio A/Mn of less than 0.8 or more than 1.2 has a tendency that crystallinity lowers. Especially with a compositional ratio A/Mn in excess of 1.2, some materials tend to be normally dielectric rather than ferroelectric and cannot be applied to devices utilizing polarization. Such a compositional ratio A/Mn is accomplished by controlling the film forming conditions as will be described later. The compositional ratio A/Mn can be determined by fluorescent X-ray analysis. It is noted that these materials have a dielectric constant of about 10 to about 50 in bulk form and about 10 to about 100 in thin film form.

The $YMnO_3$ family material which is preferably used in the present invention has a crystal structure of hexagonal system. Among $YMnO_3$ family materials there exist materials having a hexagonal crystal structure and materials having an orthorhombic crystal structure. To be ferroelectric, the material must be a crystalline material of hexagonal crystal system. More illustratively, the material is substantially of the composition: $YMnO_3$, $HoMnO_3$, $ErMnO_3$, $YbMnO_3$, $TmMnO_3$, $LuMnO_3$ and solid solutions thereof. It is noted that the ferroelectric thin film preferably has a thickness of 20 to 1,000 nm, especially 50 to 500 nm.

The ferroelectric layer contains crystals whose c plane is oriented parallel to the substrate, that is, (001) orientation. In this regard, c plane unidirectional orientation is preferred. More preferably, the layer is an epitaxial film. It is noted that the term unidirectionally oriented film used herein designates a crystallized film in which the objective crystal plane is aligned parallel to the substrate surface. A (001) unidirectionally oriented or c plane unidirectionally oriented film, for example, designates that the film as analyzed by 2θ-θ X-ray diffraction has an intensity of reflection other than on (001) plane which is up to 5% of the maximum peak intensity of reflection on (001) plane. A (111) unidirectionally oriented film used throughout the specification designates that the film has an intensity of reflection other than on (111) plane which is up to 5% of the maximum peak intensity of reflection on (111) plane. It is further noted that the term "epitaxial film" used herein means that crystals are oriented in alignment in all the directions of X, Y, and Z axes, provided that the film's substrate surface is a X-Y plane and the film's thickness direction is Z axis, and in X-ray or electron diffraction measured in the respective directions, the intensity of reflection other than the objective reflection is up to 5% of the maximum intensity on the objective plane. In the case of a (001) epitaxial film or c plane epitaxial film, for example, if a film as analyzed by 2θ-θ X-ray diffraction has an intensity of reflection other than on (001) plane which is up to 5% of the maximum peak intensity of reflection on (001) plane and as analyzed by RHEED exhibits a spotty or streaky pattern, then this film is regarded to be a (001) epitaxial film. The same applies to a (111) epitaxial film.

The substrate may be made of various materials and is preferably of single crystal. The material of the substrate may be either an insulator such as sapphire, zirconia, yttrium-stabilized zirconia, lithium niobate, and lithium tantalate or a semiconductor such as gallium arsenide and silicon. Preferred among others is a single crystal silicon substrate. Silicon single crystal is preferably used such that its (111) or (100) plane becomes a substrate surface. Especially for the MFS structure, (111) plane is preferred.

Between the substrate and the ferroelectric thin film, an epitaxial film is preferably used as an oxide intermediate layer, the epitaxial film being composed mainly of an oxide of a rare earth element (inclusive of scandium and yttrium), zirconium oxide or zirconium oxide stabilized with a rare earth element (inclusive of scandium and yttrium). The oxide intermediate layer prevents the ferroelectric layer from stripping and the good lattice matching between the ferroelectric layer and the intermediate layer ensures that the ferroelectric layer has high crystallinity.

The epitaxial film which serves as the oxide intermediate layer and is composed mainly of an oxide of a rare earth element (inclusive of scandium and yttrium) is preferably substantially of the composition: $Lu_2O_3$, $Yb_2O_3$, $TbO_2$, $Tm_2O_3$, $Er_2O_3$, $Y_2O_3$, $Ho_2O_3$, $Gd_2O_3$, $Dy_2O_3$, $Tb_2O_3$, $Pr_2O_3$, $Nd_2O_3$, $CeO_2$, $Eu_2O_3$, $Sm_2O_3$, $La_2O_3$, $Sc_2O_3$, $Lu_2O_3$, and solid solutions thereof.

The epitaxial film which serves as the oxide intermediate layer and is composed mainly of zirconium oxide or zirconium oxide stabilized with a rare earth element (inclusive of scandium and yttrium) is preferably substantially of the composition: $ZrO_2$ and stabilized zirconia having a rare earth element (inclusive of scandium and yttrium) added thereto. The preferred composition is $Zr_{1-x}R_xO_{2-\delta}$ wherein R is a rare earth metal element inclusive of scandium and yttrium, x ranges from 0 to 0.75, and δ ranges from 0 to 0.5. The preferred additive rare earth elements used in the stabilized zirconia include Y, Pr, Ce, Nd, Gd, Tb, Dy, Ho, and Er. The $ZrO_2$ film should preferably contain at least 93 mol %, more preferably at least 95 mol %, especially at least 98 mol %, further especially at least 99.5 mol % of Zr, based on the amount of only constituent elements excluding oxygen. The higher the purity, the higher is the insulating resistance and the less is the leakage current. Then the film is more suitable for use as the intermediate layer requiring insulating nature. The upper limit of the Zr content is theoretically 100% and actually films approaching to the limit are available. The $ZrO_2$ film may contain less than 7 mol % of impurities such as rare earth elements and phosphorus.

The oxide intermediate layer plays the role of providing a good matching between the lattice constant of a ferroelectric layer to be formed on the oxide intermediate layer and the lattice constant of the intermediate layer for enabling formation of a high crystallinity ferroelectric layer.

Accordingly, the oxide intermediate layer should preferably be improved in crystallinity and surface flatness. Since the $YMnO_3$ family materials to form the ferroelectric layer are crystals of hexagonal system, the oxide intermediate layer is preferably of (111) oriented crystal, especially (111) unidirectionally oriented crystal, and more preferably an epitaxial film.

As to the crystallinity of the oxide intermediate layer, the oxide intermediate layer is preferably such that a rocking curve of reflection on a (111) plane upon X-ray diffraction has a half-value width of up to 1.50°. Also preferably the oxide intermediate layer has a surface roughness (ten point mean roughness Rz) of up to 2 nm, especially up to 0.60 nm across a reference length of 500 nm over at least 80%, preferably at least 90%, especially at least 95% of its surface as measured under an atomic force microscope (AFM). The percentage is a value obtained by carrying out measurement at arbitrary 10 or more points evenly distributed over an oxide intermediate layer formed over the entire surface of a substrate having an area of 10 $cm^2$. On reflection high energy electron diffraction (RHEED) capable of evaluating the surface crystallinity of the oxide intermediate layer, it is preferred that an RHEED image of the oxide intermediate layer be highly streaky. That is, the RHEED image contains sharp streaks. These facts prove that the oxide intermediate layer is an epitaxial film and improved in crystallinity and surface flatness.

It is noted that among the oxide intermediate layers, the oxide of rare earth metal element (inclusive of scandium and yttrium) exhibits (111) orientation independent of the surface orientation of the substrate. It is also noted that zirconium oxide or zirconium oxide stabilized with a rare earth element (inclusive of scandium and yttrium) exhibits (111) orientation on (111) substrate surface, but (001) orientation on (100) substrate surface. Then a $YMnO_3$ family thin film is formed directly on the oxide intermediate layer, the (111) oriented oxide intermediate layer and the substrate are selected from the foregoing combinations.

The oxide intermediate layer as defined above is improved in both crystallinity and surface properties. Accordingly, on the surface of the oxide intermediate layer, a ferroelectric layer of quality can be formed. It is noted that no particular lower limit is imposed on the half-value width of a rocking curve and the ten point mean roughness Rz across a reference length of 500 nm and the lower the better they are. At present, the lower limit values are about 0.7° for the half-value width of a rocking curve and about 0.10 nm for the ten point mean roughness Rz across a reference length of 500 nm.

Although the thickness of the oxide intermediate layer varies with its application, it is preferably about 5 to 500 nm, more preferably about 50 to 150 nm thick. As the intermediate layer, the oxide intermediate layer should preferably have a reduced thickness of the order that does not detract from its crystallinity, surface properties, and insulation. Where the intermediate layer is used as an insulating layer of the MFIS structure, for example, it is preferably about 10 to 500 nm thick.

The MFIS and MFMIS structures are preferred as electronic devices as previously mentioned although the MFS structure is acceptable. The MFIS structure may be obtained by forming an oxide intermediate layer on a semiconductor (S), preferably on Si (100) or (111) plane, and forming a ferroelectric thin film (F) according to the present invention thereon. Where the oxide intermediate layer is provided, there is obtained an MFIS structure wherein the oxide intermediate layer functions as an insulating layer (I).

On the other hand, the MFMIS structure may be obtained by forming an oxide intermediate layer as an insulating layer (I) preferably on Si (100) or (111) plane, forming a conductive epitaxial film as a metal electrode thin film (M) thereon, and further forming a ferroelectric thin film according to the present invention thereon.

The metal electrode thin film is used as a conductive thin film which is required to form an electrode for a ferroelectric thin film of $YMnO_3$ family material and to construct a MFMIS structure necessary for application of a ferroelectric thin film of $YMnO_3$ family material to memory. That is, on a single crystal silicon substrate whose Si (111) or (100) plane is made a substrate surface is formed an epitaxial film which is made from at least one metal selected from the group consisting of Pt, Ir, Os, Re, Pd, Rh, and Ru and has (111) unidirectional orientation parallel to the substrate surface. This epitaxial film is used as the metal electrode thin film.

The electrode thin film is preferably of a metal, but may be of a non-metallic material insofar as it is a conductive epitaxial film. The conductive epitaxial film functions as an electrode underneath the ferroelectric layer, has good lattice matching with the intermediate layer, and allows for formation of a ferroelectric layer having high crystallinity.

Preferably the metal electrode thin film is of Pt, Ir, Os, Re, Pd, Rh, Ru and solid solutions thereof. The conductive epitaxial film is formed by a conductive oxide film which is preferably of an indium-containing oxide or conductive perovskite oxide, more specifically $In_2O_3$, (Sn doped) $In_2O_3$, (La, Sr) $CoO_3$, (La, Sr, Ca) $RuO_3$, (Ln, Sr) $MnO_3$ wherein Ln is rare earth, and related compounds thereof. The conductive metal or metal oxide should preferably has a resistivity of $10^{-5}$ to $10^{-2}$ $\Omega$cm in bulk form and a resistivity of $10^{-5}$ to $10^{-2}$ $\Omega$cm in thin film form. Super-conducting materials are also acceptable.

The conductive epitaxial film functions as an electrode and plays the role of providing a good matching between the lattice constant of a ferroelectric layer to be formed on the conductive epitaxial film and the lattice constant of itself for enabling a high crystallinity ferroelectric layer to be formed thereon. Consequently, the metal electrode thin film or conductive epitaxial film should preferably have improved crystallinity and surface flatness. Since the $YMnO_3$ family materials to form the ferroelectric layer are crystals of hexagonal system, the metal electrode thin film or conductive epitaxial film is preferably of (111) oriented crystal, especially (111) unidirectionally oriented crystal, and more preferably an epitaxial film.

Although the thickness of the metal thin film or conductive epitaxial film varies with its application, it is preferably about 5 to 500 nm, more preferably about 50 to 150 nm thick. The metal electrode thin film or conductive epitaxial film should preferably have a reduced thickness of the order that does not detract from its crystallinity and surface properties. Particularly when the metal electrode thin film or conductive epitaxial film functions as an electrode, it is preferably about 50 to 500 nm thick.

As in the previous embodiment, an epitaxial film is preferably used as the oxide intermediate layer between the substrate and the conductive epitaxial film, the epitaxial film being composed mainly of an oxide of a rare earth element (inclusive of scandium and yttrium), zirconium oxide or zirconium oxide stabilized with a rare earth element (inclusive of scandium and yttrium). The oxide intermediate layer used herein plays the role of improving the crystallinity and surface flatness of a metal electrode thin film or conductive epitaxial film to be formed thereon. The oxide intermediate layer also becomes an insulating layer in the MFMIS structure.

As in the previous embodiment, the epitaxial film which serves as the oxide intermediate layer and is composed mainly of an oxide of a rare earth element (inclusive of scandium and yttrium) is preferably substantially of the composition: $Lu_2O_3$, $Yb_2O_3$, $TbO_2$, $Tm_2O_3$, $Er_2O_3$, $Y_2O_3$, $Ho_2O_3$, $Gd_2O_3$, $Dy_2O_3$, $Tb_2O_3$, $Pr_2O_3$, $Nd_2O_3$, $CeO_2$, $Eu_2O_3$, $Sm_2O_3$, $La_2O_3$, $Sc_2O_3$, $Lu_2O_3$, and solid solutions thereof.

As in the previous embodiment, the epitaxial film which serves as the oxide intermediate layer and is composed mainly of zirconium oxide or zirconium oxide stabilized with a rare earth element (inclusive of scandium and yttrium) is preferably substantially of the composition: $ZrO_2$ and stabilized zirconia having a rare earth element (inclusive of scandium and yttrium) added thereto. That is, the above-defined composition: $Zr_{1-x}R_xO^{2-\delta}$ is preferred. The preferred additive rare earth elements used in the stabilized zirconia include Y, Pr, Ce, Nd, Gd, Tb, Dy, Ho, and Er. The $ZrO_2$ film should preferably contain at least 93 mol %, more preferably at least 95 mol %, especially at least 98 mol %, further especially at least 99.5 mol % of Zr, based on the amount of only constituent elements excluding oxygen. The higher the purity, the higher is the insulating resistance and the less is the leakage current. Then the film is more suitable for use as the intermediate layer requiring insulating nature. $ZrO_2$ is especially preferred as the intermediate layer because when a metal-insulator-semiconductor structure (MIS structure) is constructed from $ZrO_2$, its C-V curve contains less hysteresis and its interface properties as an MIS element are superior as compared with YSZ. The upper limit of the Zr content is 99.99% for the time being. The $ZrO_2$ film may contain less than 7 mol % of impurities such as rare earth alloys and phosphorus. An oxide intermediate layer having improved crystallinity and surface flatness is preferred.

As to crystallinity, the oxide intermediate layer may be of either (111) or (001) orientation. In either case, the metal conductive epitaxial film can assume (111) orientation. It is noted that in order that the oxide conductive epitaxial layer be of (111) orientation, an oxide intermediate layer of (111) orientation is preferably used. Preferably, a rocking curve of reflection on a (111) or (001) plane upon X-ray diffraction has a half-value width of up to 1.50° as previously mentioned. The surface of the oxide intermediate layer can be evaluated by means of an atomic force microscope (AFM) and the oxide intermediate layer has a surface roughness (ten point mean roughness Rz) of up to 2 nm, especially up to 0.60 nm across a reference length of 500 nm over at least 80%, preferably at least 90%, especially at least 95% of its surface as measured under AFM. The percentage is a value obtained by carrying out measurement at arbitrary 10 or more points evenly distributed over an oxide intermediate layer formed over the entire surface of a substrate having an area of 10 cm². On reflection high energy electron diffraction (RHEED) capable of evaluating the surface crystallinity of the oxide intermediate layer, it is preferred that an RHEED image of the oxide intermediate layer be highly streaky. That is, the preferred RHEED image contains sharp streaks. The streaky and sharp image proves that the oxide intermediate layer is an epitaxial film and improved in crystallinity and surface flatness.

The oxide intermediate layer as defined above is improved in both crystallinity and surface properties. Accordingly, on the surface of the oxide intermediate layer, a conductive epitaxial layer of quality can be formed. It is noted that no particular lower limit is imposed on the half-value width of a rocking curve and the ten point mean roughness Rz across a reference length of 500 nm and the lower the better they are. At present, the lower limit values are about 0.7° for the half-value width of a rocking curve and about 0.10 nm for the ten point mean roughness Rz across a reference length of 500 nm.

Although the thickness of the oxide intermediate layer varies with its application, it is preferably about 5 to 500 nm, more preferably about 50 to 150 nm thick. As the insulating layer (I) of the MFMIS structure, the oxide intermediate layer should be in the thickness range which is thin to the order that does not detract from its crystallinity and surface properties and which functions as an insulating layer.

The ferroelectric thin film or a laminate thereof according to the invention can be formed on a large area substrate, for example, a substrate having an area of at least 10 cm². Then not only the substrate having the ferroelectric thin film according to the invention formed thereon, but electronic devices fabricated using it become less expensive than in the prior art. No particular upper limit need be imposed on the substrate area while the substrate area may accommodate the current mainstream semiconductor process using silicon wafers of 2 to 8 inches, typically 6 inches. Instead of forming the ferroelectric thin film over the entire surface of a substrate, it is possible to form the ferroelectric thin film on only a selected area of a substrate by partial masking insofar as the substrate is 2 to 8 inches.

Next, the method for forming a ferroelectric thin film according to the present invention is described in detail.

Figure 1:
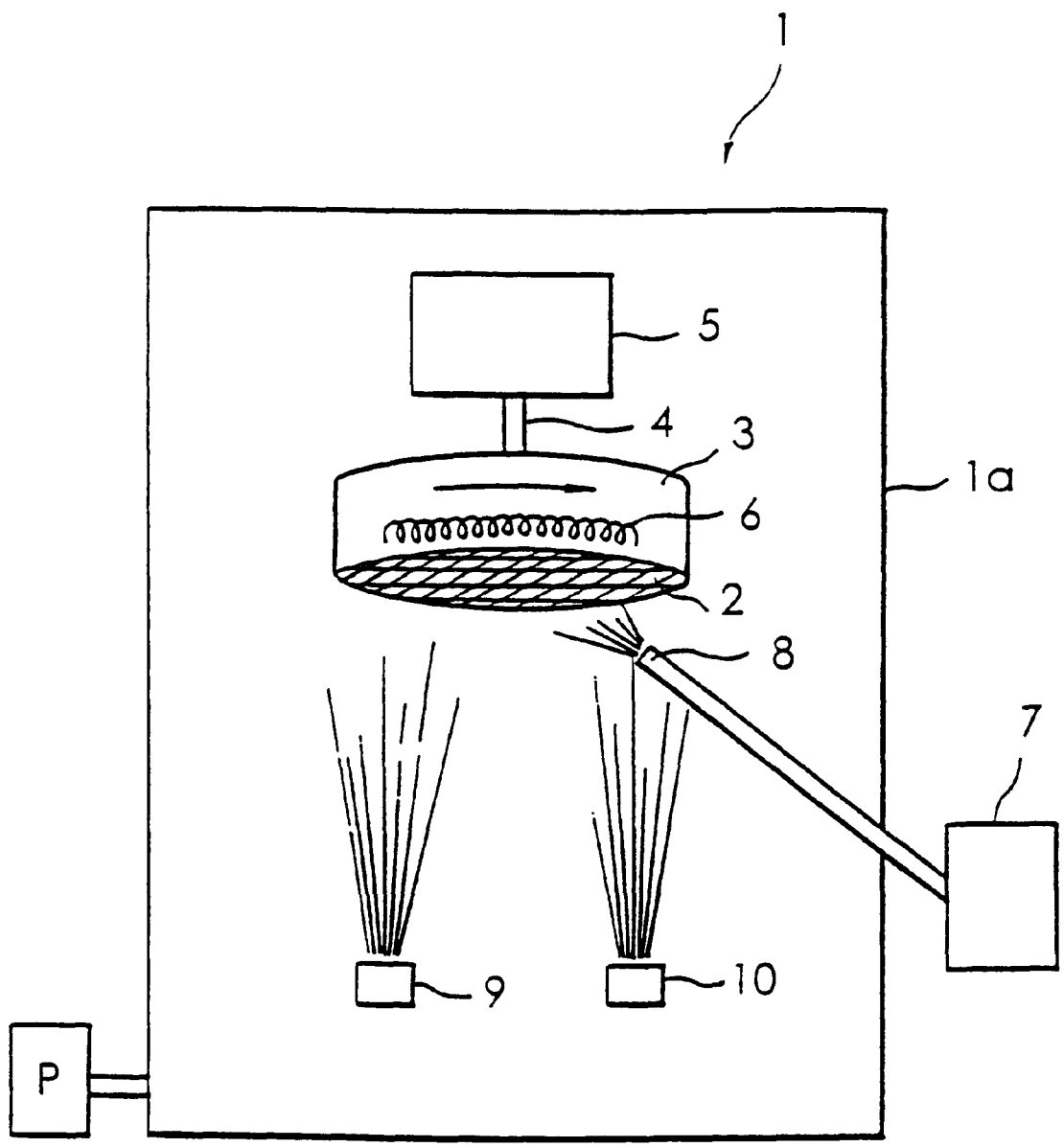
FIG. 1 is a view illustrating one exemplary evaporation apparatus used in a method for preparing a substrate for electronic devices according to the invention.

In the practice of the method of the invention, an evaporation apparatus as shown in FIG. 1 is desirably used.

The evaporation apparatus 1 includes a vacuum chamber 1a in which a holder 3 for holding a single crystal substrate 2 at a lower side thereof is disposed. The holder 3 is connected to a motor 5 through a rotating shaft 4 so that the motor 5 may drive the holder 3 to rotate the single crystal substrate 2 within its plane. A heater 6 is built in the holder 3 for heating the single crystal substrate 2.

The evaporation apparatus 1 also includes an oxidizing gas supply 7 having an oxidizing gas supply port 8 disposed immediately below the holder 3. Then an oxidizing gas is supplied so as to establish a high partial pressure in the proximity of the single crystal substrate 2. Disposed below the holder 3 is a manganese evaporation section 9 and a rare earth metal evaporation section 10. These manganese evaporation section 9 and rare earth metal evaporation section 10 include respective metal sources and energy supply means for supplying evaporating energy to the metal sources, such as electron beam emitters. Note that P in FIG. 1 designates a vacuum pump.

First, a substrate is mounted in the holder. The substrate used herein is a single crystal substrate of silicon and its (111) surface is selected as the substrate surface on which an intended oxide thin film is to be formed. Where an intermediate layer is to be interposed between the substrate and a ferroelectric layer, a substrate having an oxide intermediate layer or conductive intermediate layer whose (111) crystal face is made a substrate surface is used. Such a choice is made in order that a functional film to be formed on the substrate surface be an epitaxially grown single crystal having an appropriate orientation. The Si (111) substrate surface is preferably a mirror finished wafer which has been cleaned by etching. Etching for cleaning is done using an aqueous solution of 40% ammonium fluoride. The substrate which is used to form thereon a ferroelectric thin film according to the invention may have an area of at least 10 cm², for example. Then devices using the ferroelectric film become less expensive than in the prior art. No particular upper limit need be imposed on the substrate area while it is about 400 cm² under the current circumstances. Then the current mainstream semiconductor process using silicon wafers of 2 to 8 inches, typically 6 inches can be accommodated.

In the embodiment wherein a single crystal silicon substrate is used, since the single crystal silicon substrate as cleaned is highly reactive, it is treated on the surface as follows for the purposes of protecting the substrate surface and allowing a satisfactory ferroelectric epitaxial film to grow.

First the single crystal silicon substrate as cleaned on its surface is placed in a vacuum chamber and heated while introducing an oxidizing gas, thereby forming a silicon oxide layer on the surface of the single crystal silicon substrate. The oxidizing gas used herein may be oxygen, ozone, atomic oxygen, and $NO_2$. Since the cleaned surface of the single crystal silicon substrate is highly reactive as mentioned above, the silicon oxide layer is used as a protective film for protecting the single crystal silicon substrate's surface from rearrangement and contamination. The silicon oxide layer is preferably about 0.2 to 10 nm thick. A layer of less than 0.2 nm thick provides incomplete protection of the silicon surface. The reason for the upper limit of 10 nm is described later.

The heating of the substrate includes holding at 300 to 700° C. for 0 to about 10 minutes. The heating rate is about 30 to 70° C./min. With higher temperatures or quicker heating rates, formation of a silicon oxide film is insufficient. Conversely, with lower temperatures or longer holding times, a silicon oxide film becomes too thick.

Introduction of an oxidizing gas is preferably carried out, where oxygen is used as the oxidizing gas, for example, by first evacuating the vacuum chamber to a vacuum of about $1 \times 10^{-7}$ to $1 \times 10^{-4}$ Torr and introducing the oxidizing gas to establish an atmosphere having an oxygen partial pressure of $1 \times 10^{-4}$ Torr at least in the proximity of the single crystal silicon substrate. The oxygen partial pressure of the atmosphere reaches the upper limit where pure oxygen is used, although air may also be used. An oxygen partial pressure of about $1 \times 10^{-1}$ Torr or lower is especially preferred.

After the above-mentioned step, the substrate is heated in vacuum to form a ferroelectric layer. Reference is made herein to $YMnO_3$ as the ferroelectric layer. Other $YMnO_3$ family materials such as $HoMnO_3$ may be similarly prepared. Since the silicon surface crystals are protected by the protective film, any contamination, for example, formation of a SiC film by reaction with the residual gas, hydrocarbon is avoided. Where an intermediate layer is interposed between the substrate and the ferroelectric layer, a substrate having (111) crystal face of an oxide intermediate layer or conductive intermediate layer is set in vacuum and the following step is commenced.

Preferably the heating temperature is 600 to 1,200° C., especially 700 to 1,100° C. At temperatures below 600° C., a high crystallinity ferroelectric layer is less available. At temperatures above 1,200° C., the difference in thermal expansion between the ferroelectric layer and silicon becomes greater after room temperature is restored, causing the ferroelectric layer to be cracked or separated. Also at such high temperatures, the protective film provides insufficient protection to the silicon surface crystals, allowing the single crystal silicon substrate to disorder its crystallinity.

Next, metallic manganese, metallic yttrium, and an oxidizing gas are supplied to the surface. In this step, the metals such as Mn and Y function to reduce the protective film of silicon oxide formed in the preceding step and extinguish it. At the same time, a $YMnO_3$ crystal layer forms on the thus exposed surface of the silicon surface crystals.

In supplying metallic manganese, metallic yttrium, and an oxidizing gas to the surface, manganese is heated by electron beams or the like for evaporation whereby metallic manganese is furnished to the substrate. Metallic yttrium is similarly supplied. The film deposition rate is preferably 0.05 to 1.00 nm/s, more preferably 0.100 to 0.500 nm/s for the reason that a slower rate will invite oxidation of the substrate and a faster rate will result in a thin film having poor crystallinity and an irregular surface. Accordingly, an optimum value of film deposition rate is determined by the amount of oxygen introduced. Then, prior to deposition of a $YMnO_3$ layer, the amounts per unit time of Mn and Y metals evaporated to form deposited films of respective metals and metal oxides as a function of the power applied to the respective evaporation sources are previously determined and calibrated for each of the metals using a film gage disposed near the substrate within the vacuum chamber. The oxidizing gas used herein may be oxygen, ozone, atomic oxygen, and $NO_2$. The embodiment using oxygen is described hereinafter. While the vacuum evaporation chamber is continuously evacuated by the vacuum pump, oxygen is continuously injected at a rate of 2 to 50 cc/min., preferably 5 to 25 cc/min., through a nozzle disposed within the chamber to establish an oxygen atmosphere of the order of $10^{-3}$ to $10^{-1}$ Torr at least in the proximity of the single crystal substrate in the chamber. Since the optimum oxygen amount depends on the size of the chamber, the rate of evacuation of the pump and other factors, an appropriate flow rate is previously determined. The upper limit of the oxygen gas pressure is set at $10^{-1}$ Torr in order that the metal source in the evaporation source in the vacuum chamber be evaporated at a constant rate without deteriorating the metal source. Oxygen gas may be introduced into the vacuum evaporation chamber by injecting oxygen gas toward the surface of the single crystal substrate from the vicinity thereof to establish an atmosphere of a high oxygen partial pressure only in the proximity of the single crystal substrate whereby reaction on the substrate can be more promoted with a smaller amount of oxygen introduced. Since the vacuum chamber is continuously evacuated, the majority of the vacuum chamber is at a low pressure of $10^{-4}$ to $10^{-6}$ Torr.

On a region of the single crystal substrate as narrow as about 1 $cm^2$, oxidation reaction on the single crystal substrate can be promoted by this procedure. In order to form a film on a large single crystal substrate having an area of at least 10 $cm^2$, for example, an area of 2 inches in diameter, the substrate is rotated as shown in FIG. 1 and oxygen under a high partial pressure is supplied to the entire surface of the substrate. Film deposition over a large area is then possible. In this regard, the substrate is preferably rotated at 10 rpm or higher. At slower revolution, a film thickness distribution is created in the substrate plane. The upper limit is not particularly imposed on the revolution of the substrate although it is about 120 rpm because of the mechanical restriction of the vacuum apparatus. Understandably, formation of the oxide intermediate layer and oxide conductive epitaxial film may follow the above-mentioned procedure and formation or the metal epitaxial film may be in accord with a conventional procedure.

While the preparation method has been described in detail, this preparation method is suitable for producing an end product of high completeness to a large area in a reproducible manner because it can be carried out in an atmosphere where no impurities are involved and under easily controllable conditions as will become evident from a comparison with conventional vacuum evaporation, sputtering and laser ablation techniques. When the same method is carried out using a MBE apparatus, an end thin film can be similarly produced.

The thus obtained ferroelectric thin film can be processed by a semiconductor process, constructed as a capacitor and FET gate, and applied as devices such as non-volatile memory and infrared sensors. It may also be applied as optical modulators, optical switches, and OEIC.

Examples of the invention are given below by way of illustration.

EXAMPLE

Example 1

As the single crystal substrate on which an oxide thin film was to be grown, there was used a silicon single crystal wafer which was cut so as to make (111) plane a surface and mirror polished. After purchase, the mirror surface was cleaned by etching with a 40% ammonium fluoride aqueous solution. The silicon substrate used was a disk substrate having a diameter of 2 inches.

The single crystal substrate was secured to a substrate holder equipped with rotating and heating mechanisms installed in a vacuum chamber. The vacuum evaporation chamber was then evacuated to a vacuum of $10^{-6}$ Torr by means of an oil diffusion pump. In order to protect the cleaned surface of the substrate with silicon oxide, the substrate was rotated at 20 rpm and heated at 600° C. while introducing oxygen to the proximity of the substrate from a nozzle at a rate of 25 cc/min. A silicon oxide film was formed on the substrate surface by thermal oxidation. By this procedure, a silicon oxide film of about 1 nm thick was formed.

Thereafter, the substrate was heated at 900° C. and rotated. The number of revolutions was 20 rpm. At this point, oxygen was introduced from a nozzle at a rate of 25 cc/min. Metallic manganese and yttrium were evaporated from their sources to supply manganese and yttrium onto the substrate in amounts corresponding to a $YMnO_3$ oxide film of 5 nm thick, thereby reducing the silicon oxide formed in the preceding step with these metals and forming $YMnO_3$. By supplying metallic manganese and yttrium in a controlled molar ratio Y/Mn of 1.0/1, a $YMnO_3$ film of 300 nm thick was obtained.

Figure 2:
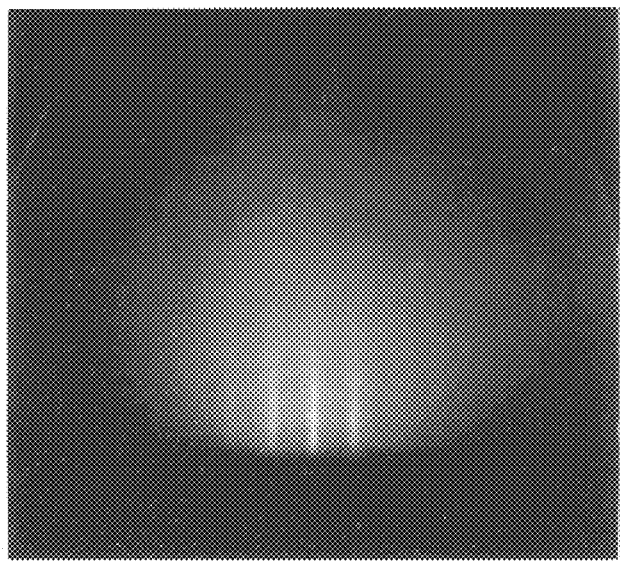
FIG. 2 is a drawing-substituting photograph showing the surface structure of a YMnO$_3$ film formed on a Si (111)

The resulting thin film was evaluated by RHEED (reflection high energy electron diffraction). FIG. 2 is a RHEED pattern of this thin film. This pattern resulted from incident electron beam in [110] direction of the silicon substrate. The diffraction pattern of the surface of the thin film of this structure is a fully streaky pattern, which indicates that $YMnO_3$ has superior crystallinity and surface properties. It is confirmed from this pattern and X-ray diffraction evaluation that the resulting $YMnO_3$ film is a hexagonal crystal, c-plane oriented film.

$YbMnO_3$ and $HoMnO_3$ films were prepared by exactly the same procedure, and evaluated by RHEED, with the results shown in FIGS. 3 and 4. These patterns show that both were epitaxial films. $YbMnO_3$ shows a somewhat spot-like pattern, from which asperities on the surface are presumed. It was confirmed that these films were hexagonal crystal, c-plane oriented films. It was observed that these ferroelectric layers were partially separated from the substrates.

Example 2

As the single crystal substrate on which an oxide thin film was to be grown, there was used a silicon single crystal (p type, 5 Ωcm) which was cut so as to make (111) plane a surface and mirror polished. After purchase, the mirror surface was cleaned by etching with a 40% ammonium fluoride aqueous solution. The silicon substrate used was a disk substrate having a diameter of 2 inches. An interposing $ZrO_2$ layer was formed on the substrate and a ferroelectric layer was formed thereon.

For formation of the $ZrO_2$ layer, the method described in the inventors' preceding application, Japanese Patent Application No. 93024/1995 was used. Specifically, the single crystal substrate was secured to a substrate holder equipped with rotating and heating mechanisms installed in a vacuum chamber. After the vacuum evaporation chamber was evacuated to a vacuum of $10^{-6}$ Torr by means of an oil diffusion pump, the substrate was heated to 850° C. and rotated. The number of revolutions was 20 rpm.

The single crystal substrate was secured to a substrate holder equipped with rotating and heating mechanisms installed in a vacuum chamber. The vacuum evaporation chamber was then evacuated to a vacuum of $10^{-6}$ Torr by means of an oil diffusion pump. In order to protect the cleaned surface of the substrate with silicon oxide, the substrate was rotated at 20 rpm and heated at 600° C. while introducing oxygen to the proximity of the substrate from a nozzle at a rate of 25 cc/min. A silicon oxide film was formed on the substrate surface by thermal oxidation. By this procedure, a silicon oxide film of about 1 nm thick was formed.

Thereafter, the substrate was heated at 900° C. and rotated. The number of revolutions was 20 rpm. At this point, oxygen was introduced from a nozzle at a rate of 25 cc/min. and metallic zirconium was evaporated from its evaporation source to supply zirconium onto the above-mentioned substrate in an amount corresponding to a zirconium oxide film of 5 nm thick, yielding a surface treated silicon substrate having a 1×1 surface structure.

Furthermore, by supplying metallic zirconium from its evaporation source onto the surface treated silicon substrate at a temperature of 900° C. and rotating at 20 rpm while introducing oxygen gas from a nozzle at a rate of 25 cc/min., a $ZrO_2$ film of 10 nm thick was formed on the treated substrate mentioned above.

FIG. 5 shows the results of X-ray diffraction analysis on the resulting thin film. In the figure, a (111) peak of $ZrO_2$ is apparently observed. The (111) peak of $ZrO_2$ is in full overlap with a peak of the silicon substrate. It is seen that there is obtained a crystal film which is intensely oriented in a direction reflecting the crystal structure and symmetry of $ZrO_2$. In particular, each of these peaks is reflection from only one reflecting surface. Especially, the $ZrO_2$ film is a unidirectionally oriented, high crystallinity film which was never found in the prior art. The rocking curve of this reflection had a half-value width of 0.7° (found value including silicon substrate), indicating superior orientation.

FIG. 6 shows a RHEED (reflection high energy electron diffraction) pattern of this thin film. The incident direction of electron beams is from [110] direction of the silicon substrate. As seen from this result, the diffraction pattern on the surface of the thin film of this structure is a completely streaky pattern, which indicates that $ZrO_2$ has superior crystallinity and surface properties. The film was measured for ten point mean roughness Rz according to JIS B-0610 (reference length L=500 nm) at 10 positions distributed over substantially the entire surface to find that the $ZrO_2$ film on the Si (111) substrate had Rz of 0.80 nm on average, 1.00 nm at maximum, and 0.08 at minimum, indicating that the surface was flat on the molecular level.

Equivalent crystallinity and surface properties were confirmed when rare earth oxides and zirconium oxides stabilized with rare earth metals were formed instead of $ZrO_2$. The $ZrO_2$ film and yttrium stabilized zirconium (YSZ) were measured for resistivity to find that the former had a 5 times higher resistivity than YSZ, indicating superior insulating properties.

Next, a ferroelectric layer was formed on the interposing $ZrO_2$ film thus obtained. Although in this example, the $ZrO_2$ film was once picked up for evaluating the interposing $ZrO_2$ film, formation of $ZrO_2$ is continuously followed by formation of a ferroelectric layer in the actual process. More particularly, the substrate on which $ZrO_2$ was formed was continuously heated at 900° C. and rotated. The number of revolutions was 20 rpm. At this point, oxygen gas was introduced from a nozzle at a rate of 25 cc/min. and metallic manganese and yttrium were evaporated from their evaporation sources onto the substrate, obtaining a YMnO$_3$ film of 300 nm thick. The amounts of metallic manganese and yttrium fed were controlled to a molar ratio Y/Mn of 1.0/1.

The resulting thin film was evaluated by RHEED (reflection high energy electron diffraction).

FIG. 7 is a RHEED pattern of this thin film. This pattern resulted from incident electron beam in [110] direction of the silicon substrate. It is seen that the diffraction pattern of the surface of the thin film of this structure is streaky, indicating that an epitaxial film was obtained.

FIG. 8 shows the results of X-ray diffraction analysis on the thin film. Only the c-plane reflection peak of YMnO$_3$ hexagonal crystal was detected, indicating a completely c-plane unidirectionally oriented film. It is evident from this pattern and RHEED evaluation that the resultant YMnO$_3$ film was a hexagonal crystal, c-plane oriented film. Although the film was formed on the interposing ZrO$_2$ in this example, it was confirmed that YMnO$_3$ films having equivalent crystallinity and surface properties were obtained when rare earth oxides and zirconium oxide stabilized with rare earth metals were interposed instead of ZrO$_2$.

FIGS. 9 to 11 show the results obtained when Y$_2$O$_3$ was used as a rare earth oxide instead of ZrO$_2$. FIG. 9 is a RHEED pattern of Y$_2$O$_3$, indicating that like ZrO$_2$, a (111) epitaxial film Of Y$_2$O$_3$ was obtained. FIGS. 10 and 11 are RHEED and X-ray diffraction patterns of the YMnO$_3$ film on the Y$_2$O$_3$ film. It is seen that like the above-mentioned YMnO$_3$ film formed on the interposing ZrO$_2$ film, this YMnO$_3$ film is a hexagonal crystal, c-plane oriented epitaxial film. Although the Si (111) substrate was used in this example, rare earth oxides such as Y$_2$O$_3$ formed a Y$_2$O$_3$ (111) epitaxial film even on a Si (100) substrate. FIGS. 12 and 13 are RHEED and X-ray diffraction patterns of Y$_2$O$_3$ (111) on Si (100). When YMnO$_3$ was further formed thereon, the YMnO$_3$ film formed on the Si (100) substrate was a hexagonal crystal, c-plane oriented epitaxial film as on the Si (111) substrate.

Similarly, HoMnO$_3$, YbMnO$_3$, ErMnO$_3$, TmMnO$_3$, and LuMnO$_3$ films and solid solutions thereof were prepared and evaluated by X-ray diffraction to find that all the films are hexagonal crystal, c-plane oriented films. It is seen from their RHEED patterns that they were all epitaxial films. Furthermore, by forming a platinum electrode on the HoMnO$_3$ film surface and forming an aluminum electrode on the silicon substrate, there was prepared a metal-ferroelectric-insulator-semiconductor (MFIS) structure, which was evaluated for C-V. The result is shown in FIG. 14. It is seen that hysteresis is developed. The hysteresis width was about 4 V. Utilizing this feature, a device using the ferroelectric thin film of the invention as a gate oxide film of FET was fabricated. The gate voltage of FET was varied to measure the source-drain current. A memory window of 3.5 V was obtained, and non-volatile memory operation was confirmed. The HoMnO$_3$, YbMnO$_3$, ErMnO$_3$, TmMnO$_3$, and LuMnO$_3$ films and solid solution films were measured for dielectric constant. The dielectric constant was about 40 which is lower by one order as compared with conventional ferroelectric materials such as PZT having a dielectric constant of 500 to 1,000. This feature is best suited for gate type non-volatile memory devices having the MFIS structure.

Example 3

As the single crystal substrate on which an oxide thin film was to be grown, there were used (1) a silicon single crystal which was cut so as to make (100) plane a surface and mirror polished and (2) a silicon single crystal which was cut so as to make (111) plane a surface and mirror polished. After purchase, the mirror surfaces were cleaned by etching with a 40% ammonium fluoride aqueous solution. The silicon substrates used were disk substrates having a diameter of 2 inches. A ZrO$_2$ layer and a conductive intermediate layer were formed on each substrate as interposing layers and a ferroelectric layer was formed thereon.

For formation of the ZrO$_2$ layer, the method described in the inventors' preceding application, Japanese Patent Application No. 93024/1995 was used. Specifically, the single crystal substrate was secured to a substrate holder equipped with rotating and heating mechanisms installed in a vacuum chamber. After the vacuum evaporation chamber was evacuated to a vacuum of 10$^{-6}$ Torr by means of an oil diffusion pump, the substrate was heated to 850° C. and rotated. The number of revolutions was 20 rpm.

The single crystal substrate was secured to a substrate holder equipped with rotating and heating mechanisms installed in a vacuum chamber. The vacuum evaporation chamber was then evacuated to a vacuum of 10$^{-6}$ Torr by means of an oil diffusion pump. In order to protect the cleaned surface of the substrate with silicon oxide, the substrate was rotated at 20 rpm and heated at 600° C. while introducing oxygen to the proximity of the substrate from a nozzle at a rate of 25 cc/min. A silicon oxide film was formed on the substrate surface by thermal oxidation. By this procedure, a silicon oxide film of about 1 nm thick was formed.

Thereafter, the substrate was heated at 900° C. and rotated. The number of revolutions was 20 rpm. At this point, oxygen gas was introduced from a nozzle at a rate of 25 cc/min. and metallic zirconium was evaporated from its evaporation source to supply zirconium onto the above-mentioned substrate in an amount corresponding to a zirconium oxide film of 5 nm thick, yielding a surface treated silicon substrate having a 1×1 surface structure.

Furthermore, by supplying metallic zirconium from its evaporation source onto the surface treated silicon substrate at a temperature of 900° C. and rotating at 20 rpm while introducing oxygen gas from a nozzle at a rate of 25 cc/min., a ZrO$_2$ film of 10 nm thick was formed on the treated substrate mentioned above.

The result of X-ray analysis on the thus obtained thin film is shown. FIG. 15 shows the X-ray diffraction diagram for the above-mentioned substrate (1) used. The diagram for the above-mentioned substrate (2) used is already shown in FIG. 5. In FIG. 15, a (002) peak indicative of the fluorite structure of ZrO$_2$ is apparently observed, indicating that there is obtained a crystal film which is intensely oriented in a direction reflecting the crystal structure and symmetry of the substrate.

Furthermore, FIG. 16 is an electron beam diffraction pattern showing the crystal structure of a thin film formed on the above-mentioned substrate (1). The electron beam diffraction pattern showing the crystal structure of a thin film formed on the above-mentioned substrate (2) is already shown in FIG. 6. It is seen from the diffraction pattern which contains sharp streaks that the film is single crystal and has a flat surface on the atomic level. These two thin films were measured for ten point mean roughness Rz according to JIS B-0610 (reference length L=500 nm) at 10 positions distributed over substantially the entire surface to find that the ZrO$_2$ (100) film on the Si (100) substrate had Rz of 0.70 nm on average, 0.95 nm at maximum, and 0.10 at minimum, and the ZrO$_2$ (111) film on the Si (111) substrate had Rz of 0.80 nm on average, 1.00 nm at maximum, and 0.08 at minimum, indicating that the surface was flat on the molecular level.

Next, a platinum film was formed on the thus obtained $ZrO_2$ film. Although in this example, the $ZrO_2$ film was once picked up for evaluating the interposing $ZrO_2$ film, formation of $ZrO_2$ is continuously followed by formation of a ferroelectric layer in the actual process. More particularly, the substrate on which $ZrO_2$ was formed was continuously heated at 700° C and rotated.

Without introducing oxygen, metallic platinum was evaporated to form Pt films of 100 nm on the $ZrO_2$ films on substrates (1) and (2). The number of revolutions was 20 rpm.

The results of X-ray analysis on the resulting Pt thin films are shown. FIG. 17 is an X-ray diffraction pattern of a Pt film formed on the $ZrO_2$ (001) film on substrate (1) and FIG. 18 is an X-ray diffraction pattern of a Pt film formed on the $ZrO_2$ (111) film on substrate (2). In both FIGS. 17 and 18, a (111) peak of Pt is apparently observed. It is seen that on both the substrates, that is, substrate (1) of Si (100) and substrate (2) of Si (111), there were obtained Pt (111) crystal films which are intensely oriented in a direction reflecting the crystal structure and symmetry.

FIG. 19 is an electron beam diffraction pattern showing the crystal structure of a thin film formed on the $ZrO_2$ (001) film on substrate (1) and FIG. 20 is an electron beam diffraction pattern showing the crystal structure of a thin film formed on the $ZrO_2$ (111) film on substrate (2). It is seen from the diffraction patterns containing sharp streaks that $ZrO_2$ is an epitaxial film.

FIGS. 21 and 22 are electron microscope photographs of these two thin films. Both the surfaces are flat. Similarly, when Ir was used instead of Pt, equivalent crystallinity and surface flatness were obtained. FIG. 23 is an electron microscope photograph of an Ir film.

Also, when rare earth metal oxides are used instead of $ZrO_2$ as shown in Example 2 and FIGS. 9 to 13, rare earth metal oxide (111) films can be formed on both the substrates, substrate (1) which is a Si (100) substrate and substrate (2) which is a Si (111) substrate. When platinum was formed on the interposing rare earth metal oxide (111) film by a similar procedure, there was obtained a Pt (111) film having exactly the same crystallinity and surface flatness as Pt on $ZrO_2$.

With the thus obtained $ZrO_2$ film and Pt film interposed, a ferroelectric layer was formed thereon. Although in this example, the Pt film was once picked up for evaluating the interposing Pt film, deposition of Pt is continuously followed by formation of a ferroelectric layer in the actual process. More particularly, the substrate on which Pt was formed was continuously heated at 900° C. and rotated. The number of revolutions was 20 rpm. At this point, oxygen gas was introduced from a nozzle at a rate of 25 cc/min. and metallic manganese and yttrium were evaporated from their evaporation sources onto the substrate, obtaining a $YMnO_3$ film of 300 rim thick. The amounts of metallic manganese and yttrium fed were controlled to a molar ratio Y/Mn of 1.0/1.

The resulting $YMnO_3$ thin film on substrate (2) or Si (111) with the $ZrO_2$ film and Pt film interposed therebetween was evaluated by RHEED (reflection high energy electron diffraction). Exactly the same $YMnO_3$ films could be formed on both the substrates, Si (100) substrate (1) and Si (111) substrate (2) with the $ZrO_2$ film and Pt film interposed therebetween. FIG. 24 is a RHEED pattern of this thin film. This pattern resulted from incident electron beam in direction [110] of the silicon substrate. It is seen that the diffraction pattern of the surface of the thin film of this structure is streaky, indicating that an epitaxial film was obtained.

FIGS. 25 and 26 show the results of X-ray diffraction analysis on these thin films. FIG. 25 corresponds to the use of substrate (1) and FIG. 26 corresponds to the use of substrate (2). Only the c-plane reflection peak of $YMnO_3$ hexagonal crystal was detected, indicating a completely oriented film. It is evident from this pattern and RHEED evaluation that the resultant $YMnO_3$ films were hexagonal crystal, c-plane oriented films. Although the firms were formed on the interposing $ZrO_2$ and Pt films in this example, it was confirmed that $YMnO_3$ films having equivalent crystallinity and surface properties were obtained when rare earth oxides and zirconium oxide stabilized with rare earth metals were interposed instead of $ZrO_2$. Equivalent results were obtained when conductive films of Ir or the like was interposed instead of the Pt film.

Similarly, $HoMnO_3$, $YbMnO_3$, $ErMnO_3$, $TmMnO_3$, and $LuMnO_3$ films and solid solutions thereof were prepared and evaluated by X-ray diffraction to find that all the films are hexagonal crystal, c-plane oriented films. It is seen from their RHEED patterns that they were all epitaxial films. As representative examples, FIGS. 27 to 29 show RHEED patterns and FIGS. 30 to 32 show X-ray diffraction patterns of $HoMnO_3$, $ErMnO_3$, and $YbMnO_3$ films, respectively.

Furthermore, by forming a platinum electrode on the $YMnO_3$, $YbMnO_3$, $ErMnO_3$, and $HoMnO_3$ film surface and taking out a lead from the platinum film formed as the interposing layer, there was obtained a Sawyer-Tower circuit which was measured for D-E hysteresis. The results are shown in FIGS. 33 to 36. All the samples produced hysteresis curves and showed ferroelectric polarization. Utilizing this D-E hysteresis feature, a memory cell was fabricated on a silicon substrate along with FET and memory operation was confirmed. It is noted that hysteresis was measured at 50 kHz and in the diagrams, one scale reading corresponds to 5 V on the abscissa and 3.0 $\mu C/cm^2$ on the ordinate. It is noted that the foregoing advantages were similarly achieved with other single crystal substrates such as sapphire, other hexagonal $YMnO_3$ family thin films other than the above-mentioned ones, or conductive epitaxial layers and oxide intermediate layers of materials other than the above-mentioned ones.

BENEFITS

The ferroelectric film of the invention is a (001) $YMnO_3$ thin film which is epitaxially grown on a silicon substrate, and the method of the invention enables formation of such a film, and can form such a film under readily controllable conditions prohibiting accidental admission of impurities, in a reproducible manner, to high quality, and even on a large surface area throughout a substrate having a diameter of more than 2 inches, and is thus worth of industrial use. More particularly, by utilizing its ferroelectric characteristics, the film can be applied to non-volatile memories, IR sensors, optical modulators, optical switches, and OEIC. The film is especially suitable for gate type non-volatile memory applications having MFIS and MFMIS structures.

We claim:

1. A method for preparing a ferroelectric film formed on a substrate having a substrate surface, the ferroelectric film having a $YMnO_3$ hexagonal crystal structure of, and composed mainly of manganese, oxygen and at least one element selected from the group consisting of rare earth elements, scandium and yttrium, said method comprising carrying out in a vacuum chamber the steps of introducing an oxidizing gas into the vacuum chamber, heating the substrate, and supplying manganese and the at least one element selected from the group consisting of rare earth elements, scandium and yttrium to the substrate surface by evaporation, thereby forming on the substrate surface the ferroelectric film which is c-plane oriented parallel to the substrate surface.

2. The method according to claim 1, wherein the steps are performed sequentially.

3. The method according to claim 1, wherein the oxidizing gas is introduced into the vacuum chamber before the substrate is heated.

4. The method according to claim 1, wherein the ferroelectric film is an epitaxial film.

5. The method according to claim 1, wherein the oxidizing gas is selected from the group consisting of diatomic oxygen ($O_2$), ozone ($O_3$), atomic oxygen (O) and nitrogen dioxide ($NO_2$).

6. A method for forming a ferroelectric film, the method comprising introducing to a vacuum chamber a silicon single crystal substrate having a (100) or (111) plane as a substrate surface;

introducing an oxidizing gas to the vacuum chamber;

forming a silicon oxide layer on the substrate surface;

evaporating manganese and at least one element selected from the group consisting of rare earth elements, scandium and yttrium on the silicon oxide layer, thereby forming the ferroelectric thin film, wherein the ferroelectric film has a $YMnO_3$ hexagonal crystal structure that is c-plane oriented parallel to the substrate surface.

7. If The method according to claim 6, wherein the ferroelectric film is an epitaxial film.

8. The method according to claim 6, wherein the oxidizing gas is selected from the group consisting of diatomic oxygen ($O_2$), ozone ($O_3$), atomic oxygen (O) and nitrogen dioxide ($NO_2$).

9. The method according to claim 6, further comprising, before forming the ferroelectric film, evaporating at least one intermediate layer on the silicon oxide layer.

10. The method according to claim 9, wherein the at least one intermediate layer comprises an oxide intermediate layer comprising at least one of zirconium, a rare earth element and yttrium.

11. The method according to claim 9, wherein the at least one intermediate layer comprises a conductive intermediate layer comprising at least one of Pt, Ir, Os, Re, Pd, Rh and Ru.

* * * * *

UNITED STATES PATENT AND TRADEMARK OFFICE
CERTIFICATE OF CORRECTION

PATENT NO. : 5,919,515

DATED : July 6, 1999

INVENTOR(S): Yoshihiko YANO, et al.

It is certified that an error appears in the above-identified patent and that said Letters Patent is hereby corrected as shown below:

On the title page item [54] and on top of column one, the title should be:

--[54] METHOD FOR PREPARING FERROELECTRIC $YMnO_3$ FILMS--

On the title page item [73] the assignee's address should be:

--Tokyo, Japan--

Signed and Sealed this

Sixteenth Day of January, 2001

Attest:

Q. TODD DICKINSON

*Attesting Officer*   *Commissioner of Patents and Trademarks*